United States Patent
Kagawa

(10) Patent No.: US 10,654,257 B2
(45) Date of Patent: May 19, 2020

(54) ELECTROMAGNETIC WAVE ABSORPTION CABLE

(71) Applicants: Seiji Kagawa, Koshigaya-shi, Saitama (JP); Atsuko Kagawa, Koshigaya-shi, Saitama (JP)

(72) Inventor: Seiji Kagawa, Koshigaya (JP)

(73) Assignees: Seiji Kagawa, Koshigaya-shi (JP); Atsuko Kagawa, Koshigaya-shi (JP)

( * ) Notice: Subject to any disclaimer, the term of this patent is extended or adjusted under 35 U.S.C. 154(b) by 219 days.

(21) Appl. No.: 16/018,482

(22) Filed: Jun. 26, 2018

(65) Prior Publication Data

US 2019/0009512 A1    Jan. 10, 2019

(30) Foreign Application Priority Data

Jul. 7, 2017  (JP) .................................. 2017-134061

(51) Int. Cl.
*B32B 37/20* (2006.01)
*B32B 15/20* (2006.01)
(Continued)

(52) U.S. Cl.
CPC ............ *B32B 37/203* (2013.01); *B32B 15/08* (2013.01); *B32B 15/20* (2013.01); *B32B 27/281* (2013.01);
(Continued)

(58) Field of Classification Search
CPC .. H05K 9/0098; H05K 9/0064; H05K 9/0081; H05K 9/0086; H05K 9/0088;
(Continued)

(56) References Cited

U.S. PATENT DOCUMENTS 8,558,115 B2   10/2013  Jenner et al.
8,993,883 B2   3/2015   Kumakura et al.
(Continued)

FOREIGN PATENT DOCUMENTS

JP   11-185542 A    7/1999
JP   2005-259385 A  9/2005
(Continued)

OTHER PUBLICATIONS

Office Action dated Jul. 29, 2019, in Korean Patent Application No. 10-2018-0077849.
(Continued)

*Primary Examiner* — Camie S Thompson
(74) *Attorney, Agent, or Firm* — Birch, Stewart, Kolasch & Birch, LLP

(57) ABSTRACT

An electromagnetic wave absorption cable comprising an electromagnetic-wave-absorbing tape spirally wound around the inner insulating sheaths surrounding conductor wires, an insulating layer, and an electromagnetic-wave-reflecting layer; the electromagnetic-wave-absorbing tape being constituted by laterally partially overlapped two electromagnetic-wave-absorbing films; a thin metal film of each electromagnetic-wave-absorbing film being provided with large numbers of substantially parallel, intermittent, linear scratches with irregular widths and intervals in plural directions; the linear scratches in each electromagnetic-wave-absorbing film having a crossing angle θs of 30-90°; the linear scratches in both electromagnetic-wave-absorbing films being crossing; and the total ($D_2+D_3$) of the longitudinal width $D_2$ of an overlapped portion of the electromagnetic-wave-absorbing films and the longitudinal width $D_3$ of an overlapped portion of the electromagnetic-wave-absorbing tape being 30-70% of the longitudinal width D of the electromagnetic-wave-absorbing tape.

10 Claims, 14 Drawing Sheets

(51) Int. Cl.
  *B32B 15/08* (2006.01)
  *B32B 27/28* (2006.01)
  *B32B 27/34* (2006.01)
  *H01B 11/08* (2006.01)
  *H05K 9/00* (2006.01)
  *B32B 27/36* (2006.01)
  *H01B 11/10* (2006.01)
  *B32B 37/24* (2006.01)
  *B32B 38/00* (2006.01)

(52) U.S. Cl.
  CPC ............ *B32B 27/34* (2013.01); *B32B 27/365* (2013.01); *H01B 11/085* (2013.01); *H01B 11/1008* (2013.01); *H05K 9/0098* (2013.01); B32B 2037/243 (2013.01); B32B 2038/0092 (2013.01); B32B 2307/202 (2013.01); B32B 2457/00 (2013.01); *H01B 11/1025* (2013.01)

(58) Field of Classification Search
  CPC ................ H05K 9/0083; H01B 11/085; H01B 11/1008; H01B 11/1025; H01B 11/105; H01B 11/00; H01B 3/30; H01B 3/02; B32B 15/20; B32B 15/08; B32B 37/203; B32B 2307/202; B32B 2307/212; B32B 2307/102; B32B 2307/208; B32B 2307/304; B32B 2457/00; B32B 2250/02; B32B 2250/03; B32B 2255/10; B32B 2255/20; B32B 2255/205; B32B 2255/28; B32B 25/02; B32B 25/08; B32B 27/08; B32B 27/20; B32B 3/12; B32B 3/28; B32B 3/30; H01Q 17/00; H01Q 1/526; H01F 1/26; E04B 2001/925

USPC ........ 174/386, 388, 108, 109, 106 R, 113 R; 324/4; 156/53
See application file for complete search history.

(56)     References Cited

U.S. PATENT DOCUMENTS

| 9,269,479 | B2 | 2/2016 | Jenner et al. |
| 9,424,964 | B1 | 8/2016 | Kithuka et al. |
| 2009/0075068 | A1 | 3/2009 | Pyo et al. |
| 2010/0224389 | A1* | 9/2010 | Jenner ................ B23K 26/0846 174/113 R |
| 2011/0008580 | A1 | 1/2011 | Kagawa et al. |
| 2012/0152589 | A1 | 6/2012 | Kumakura et al. |
| 2014/0027036 | A1 | 1/2014 | Jenner et al. |
| 2015/0027771 | A1 | 1/2015 | Kagawa |
| 2015/0382518 | A1 | 12/2015 | Kagawa et al. |
| 2016/0155541 | A1 | 6/2016 | Jenner et al. |

FOREIGN PATENT DOCUMENTS

| JP | 2009-71266 A | 4/2009 |
| JP | 4685977 B2 | 2/2011 |
| JP | 2012-133991 A | 7/2012 |
| JP | 2012-519939 A | 8/2012 |
| JP | 2013-84864 A | 5/2013 |
| KR | 10-2014-0099921 A | 8/2014 |

OTHER PUBLICATIONS

Japanese Office Action for Application No. 2017-134061 dated Aug. 4, 2017.

Office Action dated Dec. 24, 2019, in Indian Patent Application No. 201814022853.

* cited by examiner

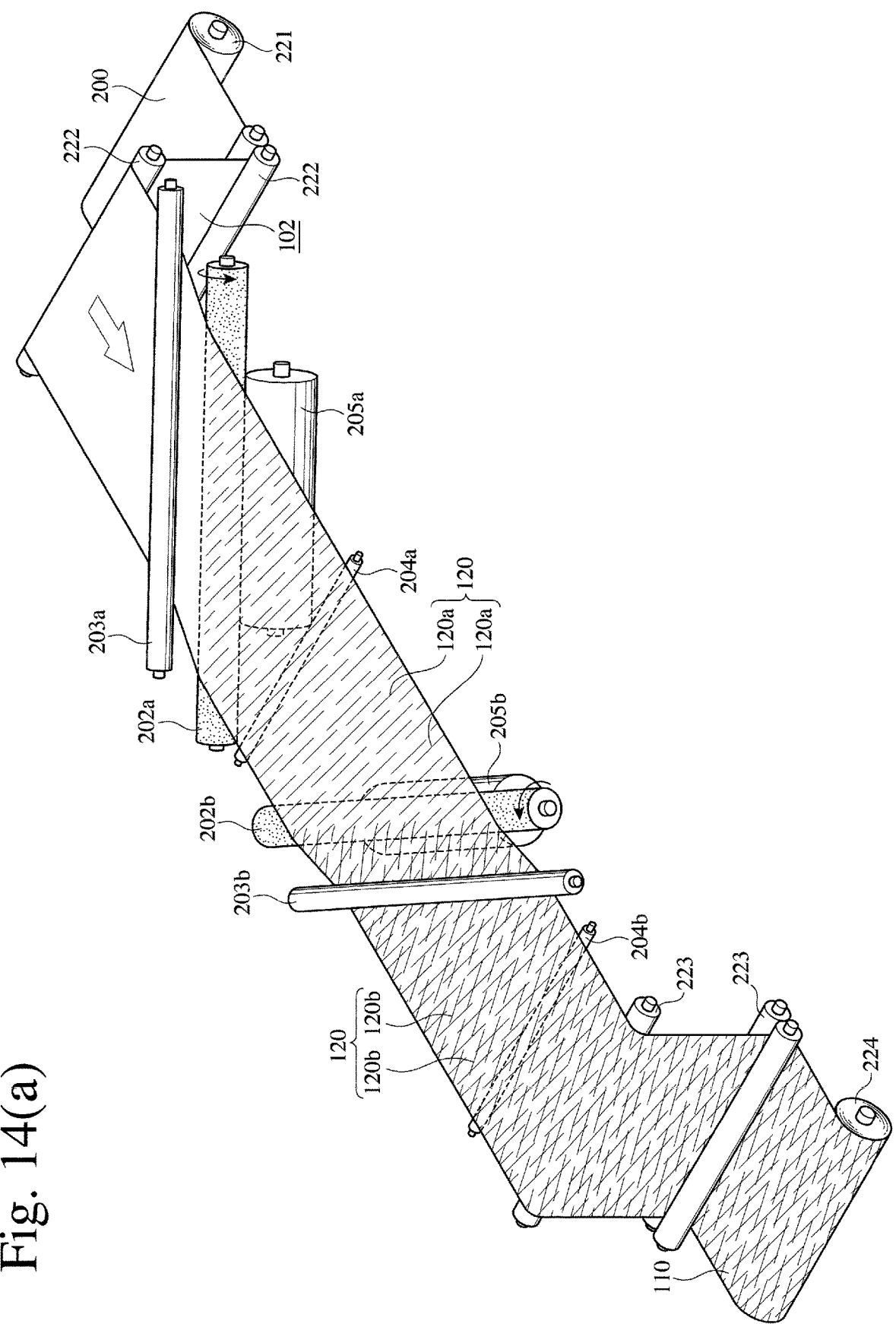

ELECTROMAGNETIC WAVE ABSORPTION CABLE

FIELD OF THE INVENTION

The present invention relates to an electromagnetic wave absorption cable having high electromagnetic wave absorbability.

BACKGROUND OF THE INVENTION

Electromagnetic waves are radiated from cables of electric appliances and electronic appliances, and ambient electromagnetic waves intrude into cables, so that noises enter signals. To prevent the radiation and intrusion of electromagnetic waves to and from cables, cables are conventionally shielded with metal nets or foils. For example, JP 11-185542 A discloses a cable having a thin magnetic shield film, which comprises an insulating tape wound around pluralities of signal-transmitting cables, a laminate tape of a high-conductivity metal foil (copper foil, etc.) and a thin film of a high-permeability material (permalloy, etc.) wound around the insulating tape, and an insulator wound around the laminate tape. However, it fails to achieve complete shielding for high-frequency noises. Accordingly, it is proposed to prevent the radiation and intrusion of electromagnetic waves by absorption instead of shielding.

JP 2005-259385 A discloses a communications cable comprising pluralities of first pair-conductor cables each comprising two metal wires electrically insulated with a rubber sheath, a first sheath covering the first pair-conductor cables, pluralities of second pair-conductor cables each comprising two metal wires electrically insulated with a rubber sheath, a second sheath covering the second pair-conductor cables, a metal net outside the second sheath, and an insulator layer. Each of the first and second sheaths has a two-layer structure comprising a magnetic layer and a conductor layer. The magnetic layer is formed by, for example, a sheet comprising fine amorphous alloy particles bonded by a binder, and the conductor layer is formed by, for example, a sheet comprising fine silver particles bonded by a binder. However, because the sheath having a two-layer structure comprising a magnetic layer and a conductor layer is used in this communications cable, the cable is inevitably thick and expensive.

JP 2009-71266 A discloses a communications cable having a structure comprising a signal-conducting wire or power-conducting wire covered with an insulating layer, an electromagnetic-wave-absorbing/shielding film comprising an electromagnetic-wave-shielding layer and an electromagnetic-wave-absorbing layer being wound around the cable in the insulating layer. An exemplified electromagnetic-wave-shielding layer is an electromagnetic-wave-shielding film as thick as 17-70 μm, which is constituted by a polymer film laminated with an aluminum or copper foil or vapor-deposited with Al or Cu. An exemplified electromagnetic-wave-absorbing layer is an electromagnetic-wave-absorbing film as thick as 10-100 μm, which is coated with a paint containing metal flake and/or electromagnetic-wave-absorbing Fe—Si alloy powder, Fe—Si—Cr alloy powder, amorphous metal powder, etc. However, because the electromagnetic-wave-absorbing/shielding film has a two-layer structure comprising the electromagnetic-wave-shielding layer and the electromagnetic-wave-absorbing layer both relatively thick, the communications cable is inevitably thick and expensive.

Because the cables are likely arranged in electric appliances and electronic appliances having complicated structures, they are preferably as thin as possible. However, with a structure having both electromagnetic-wave-shielding layer and electromagnetic-wave-absorbing layer as in the above conventional technology, it is difficult to make the cable thinner. In addition, the two-layer structure of an electromagnetic-wave-shielding layer and an electromagnetic-wave-absorbing layer makes the cable expensive.

OBJECT OF THE INVENTION

Accordingly, an object of the present invention is to provide an inexpensive electromagnetic wave absorption cable capable of effectively suppressing the radiation and intrusion of electromagnetic waves, which can be easily made thinner.

DISCLOSURE OF THE INVENTION

As a result of intensive research in view of the above object, the inventor has found that the radiation and intrusion of electromagnetic waves can be effectively suppressed by (1) laterally partially overlapping two electromagnetic-wave-absorbing films each having a single- or multi-layer, thin metal film formed on a surface of plastic film, the thin metal film being provided with large numbers of substantially parallel, intermittent, linear scratches with irregular widths and intervals in plural directions, to form an electromagnetic-wave-absorbing tape; (2) winding the electromagnetic-wave-absorbing tape around a power or signal conductor wire, which is called "conductor wire" for short; (3) making linear scratches in one electromagnetic-wave-absorbing film and linear scratches in the other electromagnetic-wave-absorbing film in the electromagnetic-wave-absorbing tape crossing each other; and (4) setting the total ($D_2+D_3$) of the longitudinal width $D_2$ of an overlapped portion of the electromagnetic-wave-absorbing films, which may be called simply "longitudinal film overlap width $D_2$," and the longitudinal width $D_3$ of an overlapped portion of the electromagnetic-wave-absorbing tape, which may be called simply "longitudinal tape overlap width $D_3$," to 30-70% of the longitudinal width D of the electromagnetic-wave-absorbing tape, which may be called simply "longitudinal tape width D." The present invention has been completed based on such finding.

The first electromagnetic wave absorption cable of the present invention comprises at least one conductor wire, at least one inner insulating sheath surrounding each conductor wire, and an electromagnetic-wave-absorbing tape spirally wound around each or all of the inner insulating sheaths;

the electromagnetic-wave-absorbing tape being constituted by two electromagnetic-wave-absorbing films which are laterally partially overlapped;

each electromagnetic-wave-absorbing film comprising a plastic film, and a single- or multi-layer, thin metal film formed on at least one surface of the plastic film, the thin metal film being provided with large numbers (pluralities) of substantially parallel, intermittent, linear scratches with irregular widths and intervals in plural directions;

the linear scratches in each electromagnetic-wave-absorbing film having an acute crossing angle θs in a range of 30-90°;

the linear scratches in one electromagnetic-wave-absorbing film and the linear scratches in the other electromagnetic-wave-absorbing film being crossing each other; and the total ($D_2+D_3$) of the longitudinal width $D_2$ of an overlapped portion of the electromagnetic-wave-absorbing films and the longitudinal width $D_3$ of an overlapped portion of the electromagnetic-wave-absorbing tape being 30-70% of the longitudinal width D of the electromagnetic-wave-absorbing tape.

The second electromagnetic wave absorption cable of the present invention comprises at least one conductor wire, at least one inner insulating sheath surrounding each conductor wire, an electromagnetic-wave-absorbing tape spirally wound around each or all of the inner insulating sheaths, an insulating layer covering the electromagnetic-wave-absorbing tape, and an electromagnetic-wave-reflecting layer covering the insulating layer;

the electromagnetic-wave-absorbing tape being constituted by two electromagnetic-wave-absorbing films which are laterally partially overlapped;

each electromagnetic-wave-absorbing film comprising a plastic film, and a single- or multi-layer, thin metal film formed on at least one surface of the plastic film, the thin metal film being provided with large numbers (pluralities) of substantially parallel, intermittent, linear scratches with irregular widths and intervals in plural directions;

the linear scratches in each of the electromagnetic-wave-absorbing films having an acute crossing angle θs in a range of 30-90°;

the linear scratches in one electromagnetic-wave-absorbing film and the linear scratches in the other electromagnetic-wave-absorbing film are crossing each other; and the total ($D_2+D_3$) of the longitudinal width $D_2$ of an overlapped portion of the electromagnetic-wave-absorbing films and the longitudinal width $D_3$ of an overlapped portion of the electromagnetic-wave-absorbing tape being 30-70% of the longitudinal width D of the electromagnetic-wave-absorbing tape.

In the first and second electromagnetic wave absorption cables, the width W of the electromagnetic-wave-absorbing tape, the widths $W_1$, $W_2$ of both electromagnetic-wave-absorbing films, and the width Wo of an overlapped portion of both electromagnetic-wave-absorbing films preferably meet the relations of $W=W_1+W_2-Wo$, and Wo/W=20-60%.

The longitudinal width $D_3$ of an overlapped portion of the electromagnetic-wave-absorbing tape is preferably 1-50% of the longitudinal width D of the electromagnetic-wave-absorbing tape.

In the first and second electromagnetic wave absorption cables, the minimum crossing angle α between the linear scratches in one electromagnetic-wave-absorbing film and the linear scratches in the other electromagnetic-wave-absorbing film is preferably 10-45°.

In the second electromagnetic wave absorption cable, the insulating layer is preferably made of a thermoplastic resin or rubber. The insulating layer preferably contains magnetic particles. The insulating layer is preferably as thick as 1 mm or more.

In the second electromagnetic wave absorption cable, the electromagnetic-wave-reflecting layer is preferably constituted by a plastic film, and a single- or multi-layer, thin metal film formed on the plastic film. The thin metal film in the electromagnetic-wave-reflecting layer is preferably made of at least one metal selected from the group consisting of aluminum, copper, silver, tin, nickel, cobalt, chromium and their alloys. The thin metal film in the electromagnetic-wave-reflecting layer is preferably a vapor-deposited film. A ground line is preferably attached to the electromagnetic-wave-reflecting layer.

In the electromagnetic-wave-absorbing film in the first and second electromagnetic-wave-absorbing tapes, the linear scratches preferably have widths in a range of 0.1-100 µm for 90% or more and 1-50 µm on average, and the lateral intervals of the linear scratches are preferably in a range of 1-500 µm, and 1-200 µm on average.

In the electromagnetic-wave-absorbing film in the first and second electromagnetic-wave-absorbing tapes, the linear scratches are preferably inclined at an angle in a range of 30-60° relative to the conductor wire.

In the electromagnetic-wave-absorbing film in the first and second electromagnetic-wave-absorbing tapes, the thin metal film is preferably as thick as 0.01-10 µm.

In the electromagnetic-wave-absorbing film in the first and second electromagnetic-wave-absorbing tapes, the thin metal film is preferably made of at least one metal selected from the group consisting of aluminum, copper, silver, tin, nickel, cobalt, chromium and their alloys. The thin metal film is preferably a vapor-deposited aluminum film.

BRIEF DESCRIPTION OF THE DRAWINGS

FIG. 14(a) is a perspective view showing an example of apparatuses for forming linear scratches.

DESCRIPTION OF THE PREFERRED EMBODIMENTS

The embodiments of the present invention will be explained in detail referring to the attached drawings, and it should be noted that explanations concerning one embodiment are applicable to other embodiments unless otherwise mentioned. Also, the following explanations are not restrictive, but various modifications may be made within the scope of the present invention.

[1] Embodiment (1) Basic Structure of the Present Invention

Figure 1:
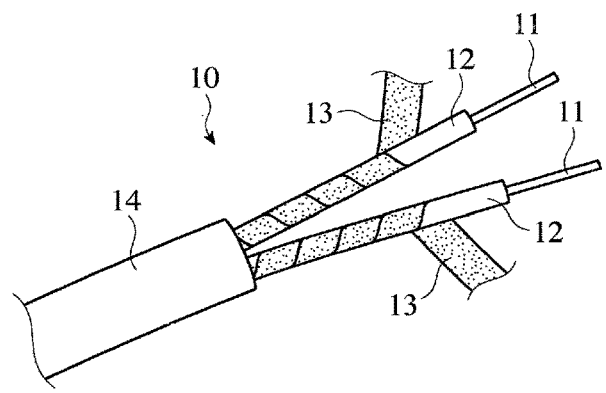
FIG. 1 is a partial, exploded, perspective view showing an example of electromagnetic wave absorption cables having the basic structure for the present invention.

FIG. 1 shows an example of electromagnetic wave absorption cables 10 having the basic structure of the present invention. The electromagnetic wave absorption cable 10 comprises a pair of conductor wires 11, 11, inner insulating sheaths 12, 12 each surrounding each conductor wire 11, electromagnetic-wave-absorbing tapes 13, 13 each spirally wound around each inner insulating sheath 12, and an outer insulating sheath 14 covering the electromagnetic-wave-absorbing tapes 13, 13. The electromagnetic-wave-absorbing tape 13 is constituted by electromagnetic-wave-absorbing films each comprising a plastic film, and a single- or multi-layer, thin metal film formed on at least one surface of the plastic film, the thin metal film being provided with large numbers of substantially parallel, intermittent, linear scratches with irregular widths and intervals in plural directions, the acute crossing angle θs of linear scratches in each electromagnetic-wave-absorbing film being in a range of 30-90°.

FIGS. 11(a)-11(d) show an electromagnetic-wave-absorbing film 110 having a single-layer, thin metal film 102 formed on a plastic film 101, the thin metal film 102 being provided with large numbers of substantially parallel, intermittent, linear scratches 120 (120a, 120b) with irregular widths and intervals in plural (two) directions. FIGS. 12(a) and 12(b) show an electromagnetic-wave-absorbing film 110 having a multi-layer, thin metal film 102a, 102b formed on a plastic film 101, the thin metal film 102a, 102b being provided with large numbers of substantially parallel, intermittent, linear scratches 120 (120a, 120b) with irregular widths and intervals in plural directions.

Figure 2:
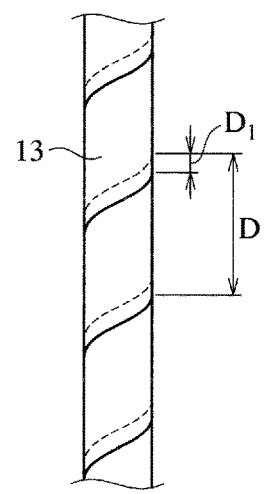
FIG. 2 is a plan view showing an electromagnetic-wave-absorbing tape wound around an inner insulating sheath in the electromagnetic wave absorption cable shown in FIG. 1.

As shown in FIG. 2, the width $D_1$ of a longitudinally (in a cable direction) overlapped portion of the wound electromagnetic-wave-absorbing tape 13, which may be called simply "longitudinal tape overlap width $D_1$," is preferably 1-80%, more preferably 2-60%, most preferably 10-50%, of the longitudinal width D (in a cable direction) of the wound electromagnetic-wave-absorbing tape 13, which may be called simply "longitudinal tape width" D. Because each conductor wire 11 is surrounded by the electromagnetic-wave-absorbing tape 13 in this electromagnetic wave absorption cable 10, noises between the conductor wires 11, 11 can be suppressed. The longitudinal width D of the electromagnetic-wave-absorbing tape 13 is preferably 5-50 mm, though variable depending on the thickness of the electromagnetic wave absorption cable 10.

Figure 4:
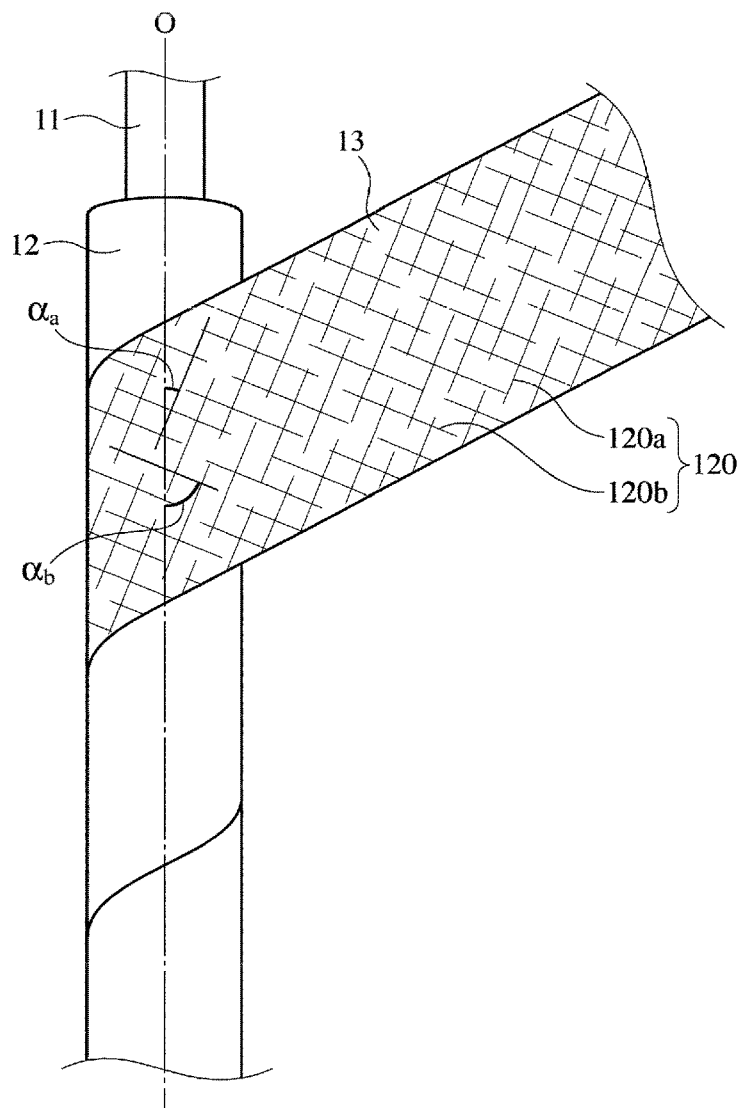
FIG. 4 is a partial, exploded plan view showing the inclination angle of linear scratches to a centerline of a conductor wire in an electromagnetic-wave-absorbing tape wound around an inner insulating sheath in the electromagnetic wave absorption cable shown in FIG. 1.
Figure 5:
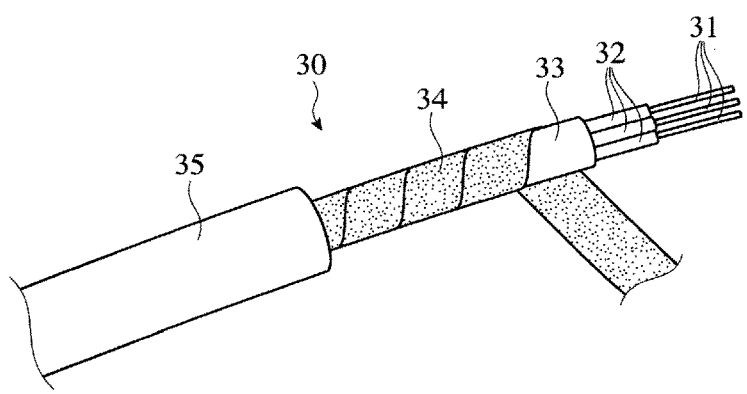
FIG. 5 is a partial, exploded, perspective view showing the first electromagnetic wave absorption cable of the present invention.

As shown in FIG. 4, any linear scratches 120a, 120b are preferably inclined at angles $\alpha_a$, $\alpha_b$ in a range of 30-60° to a centerline O of the conductor wire 11. The inclination angles $\alpha_a$, $\alpha_b$ are more preferably 40-50°. With any linear scratches 120a, 120b inclined at angles $\alpha_a$, $\alpha_b$ in this range, electromagnetic waves radiated from and intruding into the conductor wire 11 can be most efficiently absorbed.

Figure 3:
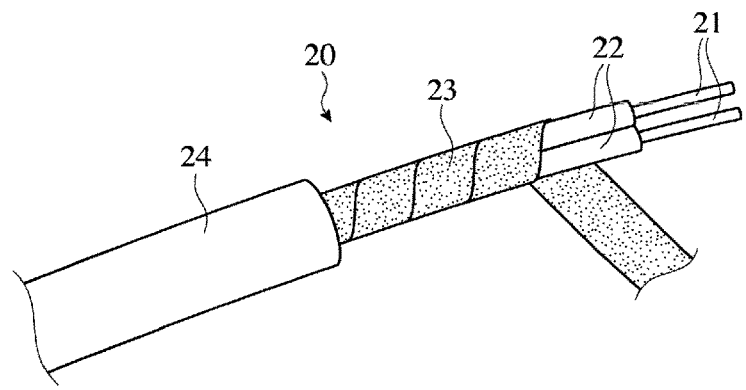
FIG. 3 is a partial, exploded, perspective view showing another example of electromagnetic wave absorption cables having the basic structure for the present invention.

FIG. 3 shows another example of electromagnetic wave absorption cables 20. The electromagnetic wave absorption cable 20 comprises a pair of conductor wires 21, 21, inner insulating sheaths 22, 22 each surrounding each conductor wire 21, an electromagnetic-wave-absorbing tape 23 spirally wound around both inner insulating sheaths 22, 22, and an outer insulating sheath 24 covering the electromagnetic-wave-absorbing tape 23. Like the electromagnetic-wave-absorbing tape 13, the electromagnetic-wave-absorbing tape 23 is also constituted by electromagnetic-wave-absorbing films 110 each comprising a plastic film 110, and a single- or multi-layer, thin metal film 102 formed on at least one surface of the plastic film 110, the thin metal film 102 being provided with large numbers of substantially parallel, intermittent, linear scratches 120 (120a, 120b) with irregular widths and intervals in plural directions, as shown in FIGS. 11(a)-11(d), 12(a) and 12(b).

As in the electromagnetic wave absorption cable 10 shown in FIG. 1, the longitudinal width D of the electromagnetic-wave-absorbing tape 23 (longitudinal tape width D) in the electromagnetic wave absorption cable 20 shown in FIG. 3 is preferably 5-50 mm, and the ratio $D_1/D$ of the longitudinal tape overlap width $D_1$ to the longitudinal tape width D is preferably 1-80%, more preferably 2-60%, most preferably 10-50%. This electromagnetic wave absorption cable 20 is suitable for power lines, etc., because noises between both conductor wires 21, 21 are not to be suppressed.

(2) First Embodiment

As shown in FIGS. 5 and 7-9, an example of the first electromagnetic wave absorption cables 30 of the present invention comprises at least one conductor wire 31 (pluralities of conductor wires 31 in the depicted example), inner insulating sheaths 32 each surrounding each conductor wire 31, an electromagnetic-wave-absorbing tape 34 spirally wound around each or all of the inner insulating sheaths 32

(all of the inner insulating sheaths 32 in the depicted example) via an insulating sheath 33, and an outer insulating sheath 35 covering the electromagnetic-wave-absorbing tape 34;

the electromagnetic-wave-absorbing tape 34 being constituted by two electromagnetic-wave-absorbing films 34a, 34b, which are laterally partially overlapped;

each electromagnetic-wave-absorbing film 34a, 34b comprising a plastic film 101, and a single- or multi-layer, thin metal film 102 formed on at least one surface of the plastic film 101, the thin metal film 102 being provided with large numbers of substantially parallel, intermittent, linear scratches 120 (120a, 120b) with irregular widths and intervals in plural directions;

the linear scratches 120a, 120b in each electromagnetic-wave-absorbing film 34a, 34b having an acute crossing angle θs in a range of 30-90°;

the linear scratches 120a of one electromagnetic-wave-absorbing film 34a and the linear scratches 120b of the other electromagnetic-wave-absorbing film 34b being crossing; and the total $(D_2+D_3)$ of the longitudinal width $D_2$ of an overlapped portion 34c of the electromagnetic-wave-absorbing films 34a, 34b and the longitudinal width $D_3$ of an overlapped portion of the electromagnetic-wave-absorbing tape 34 being 30-70% of the longitudinal width D of the electromagnetic-wave-absorbing tape 34.

The width W of the electromagnetic-wave-absorbing tape 34, the widths $W_1$, $W_2$ of both electromagnetic-wave-absorbing films 34a, 34b, and the width Wo of the overlapped portion 34c of both electromagnetic-wave-absorbing films 34a, 34b preferably meet the relations of $W=W_1+W_2-Wo$, and Wo/W=20-60%. It has been found that when the Wo/W ratio is less than 20% or more than 60%, the electromagnetic-wave-absorbing tape 34 constituted by two electromagnetic-wave-absorbing films 34a, 34b has reduced electromagnetic wave absorbability. The lower limit of the Wo/W ratio is preferably 25%, more preferably 30%. The upper limit of the Wo/W ratio is preferably 55%, more preferably 50%.

Figure 8:
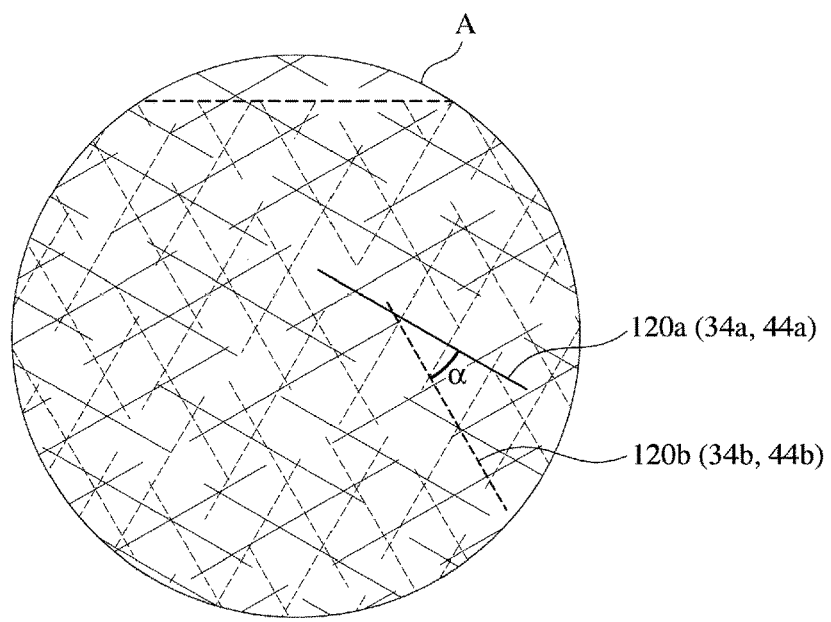
FIG. 8 is an enlarged view showing a portion A in FIG. 7.

As shown in FIG. 8, the minimum crossing angle α between linear scratches 120a in one electromagnetic-wave-absorbing film 34a and linear scratches 120b in the other electromagnetic-wave-absorbing film 34b is preferably 10-45°. The minimum crossing angle α of less than 10° or more than 45° tends to lead to lower electromagnetic wave absorbability. The minimum crossing angle α is more preferably 15-45°, most preferably 20-45°.

Figure 9:
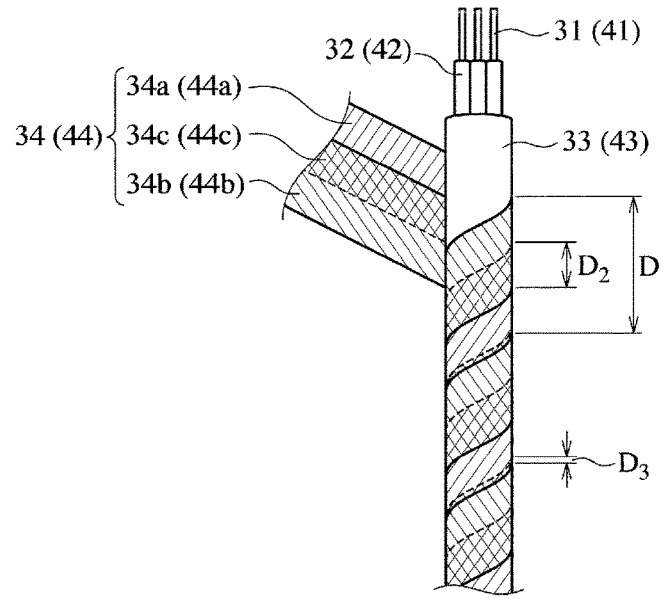
FIG. 9 is a partially developed plan view showing an electromagnetic-wave-absorbing tape wound around an inner insulating sheath in the first and second electromagnetic wave absorption cables of the present invention.

As shown in FIG. 9, in the spirally wound electromagnetic-wave-absorbing tape 34, a ratio $(D_2/D)$ of the longitudinal width $D_2$ (in a cable direction) of the overlapped portion 34c of the electromagnetic-wave-absorbing film 34a, 34b to the longitudinal width D of the electromagnetic-wave-absorbing tape 34 is the same as the Wo/W ratio.

The total $(D_2+D_3)$ of the longitudinal width $D_2$ (in a cable direction) of the overlapped portion 34c of the electromagnetic-wave-absorbing films 34a, 34b and the longitudinal width $D_3$ (in a cable direction) of an overlapped portion of the electromagnetic-wave-absorbing tape 34 is 30-70% of the longitudinal width D of the electromagnetic-wave-absorbing tape 34. $(D_2+D_3)$ represents the longitudinal length of an overlapping region of two electromagnetic-wave-absorbing films 34a, 34b with crossing linear scratches, and $[D-(D_2+D_3)]$ represents the longitudinal length of a region having only one electromagnetic-wave-absorbing film 34a, 34b. It has been found that when the $(D_2+D_3)/D$ ratio is less than 30% or more than 70%, the electromagnetic-wave-absorbing tape 34 constituted by two electromagnetic-wave-absorbing films 34a, 34b has reduced electromagnetic wave absorbability. This is an unexpected effect, and the $(D_2+D_3)/D$ ratio of 30-70% is an important feature of the present invention. The lower limit of the $(D_2+D_3)/D$ ratio is preferably 40%, more preferably 45%. The upper limit of the $(D_2+D_3)/D$ ratio is preferably 65%, more preferably 60%.

A $D_3/D$ ratio of the longitudinal width $D_3$ of an overlapped portion of the electromagnetic-wave-absorbing tape 34 to the longitudinal width D of the electromagnetic-wave-absorbing tape 34 is calculated by subtracting $D_2/D$ from $(D_2+D_3)/D$. The $D_3/D$ ratio is preferably 1-50%, more preferably 2-45%, most preferably 5-40%.

Like the electromagnetic wave absorption cable shown in FIG. 4, the linear scratches 120a, 120b of the electromagnetic-wave-absorbing films 34a, 34b in the electromagnetic-wave-absorbing tape 34 wound around the inner insulating sheath 32 via the insulating sheath 33 are preferably inclined at angles $α_a$, $α_b$ in a range of 30-60° to the conductor wire 21.

Like the electromagnetic wave absorption cable shown in FIG. 2, the longitudinal width D of the electromagnetic-wave-absorbing tape 34 is preferably 5-50 mm, and the ratio $D_1/D$ of the longitudinal tape overlap width $D_1$ to the longitudinal tape width D is preferably 1-80%, more preferably 2-60%, most preferably 10-50%.

(3) Second Embodiment

As shown in FIGS. 6-9, the second electromagnetic wave absorption cable 40 of the present invention comprises at least one conductor wire 41 (pluralities of conductor wires 41 in the depicted example), inner insulating sheaths 42 each surrounding each conductor wire 41, an electromagnetic-wave-absorbing tape 44 spirally wound around each or all of the inner insulating sheaths 42 (all of the inner insulating sheaths 42 in the depicted example) via an insulating sheath 43, an insulating layer 45 covering the electromagnetic-wave-absorbing tape 44, an electromagnetic-wave-reflecting layer 46 covering the insulating layer 45, and an outer insulating sheath 47 covering the electromagnetic-wave-reflecting layer 46;

the electromagnetic-wave-absorbing tape 44 being constituted by two electromagnetic-wave-absorbing films 44a, 44b, which are laterally partially overlapped;

each electromagnetic-wave-absorbing film 44a, 44b comprising a plastic film 101, and a single- or multi-layer, thin metal film 102 formed on at least one surface of the plastic film 101, the thin metal film 102 being provided with large numbers of substantially parallel, intermittent, linear scratches 120 (120a, 120b) with irregular widths and intervals in plural directions;

the linear scratches in each electromagnetic-wave-absorbing film 44a, 44b having an acute crossing angle θs in a range of 30-90°;

the linear scratches 120a in one electromagnetic-wave-absorbing film 44a and the linear scratches 120b in the other electromagnetic-wave-absorbing film 44b are crossing; and the total $(D_2+D_3)$ of the longitudinal width $D_2$ of an overlapped portion 44c of the electromagnetic-wave-absorbing films 44a, 44b and the longitudinal width $D_3$ of an overlapped portion of the electromagnetic-wave-absorbing tape 44 is 30-70% of the longitudinal width D of the electromagnetic-wave-absorbing tape 44.

The second electromagnetic wave absorption cable 40 has the same structure as that of the first electromagnetic wave absorption cable 30, except for having the insulating layer 45 and the electromagnetic-wave-reflecting layer 46. Accordingly, it is the same as the first electromagnetic wave absorption cable 30 with respect to the Wo/W ratio, the $(D_2+D_3)/D$ ratio, the $D_2/D$ ratio and the $D_3/D$ ratio. Also, the minimum crossing angle α between linear scratches 120a in one electromagnetic-wave-absorbing film 44a and linear scratches 120b in the other electromagnetic-wave-absorbing film 44b is preferably 10-45°, more preferably 15-45°, most preferably 20-45°.

The linear scratches 120a, 120b of the electromagnetic-wave-absorbing films 44a, 44b in the electromagnetic-wave-absorbing tape 44 wound around the inner insulating sheath 42 via the insulating sheath 43 are preferably inclined at angles $α_a$, $α_b$ in a range of 30-60° to the conductor wire 41.

The insulating layer 45 for separating the electromagnetic-wave-reflecting layer 46 from the electromagnetic-wave-absorbing tape 44 is preferably made of a thermoplastic resin or rubber having high insulation and flexibility. The thermoplastic resins are preferably polyethylene, polyvinyl chloride, etc., and the rubbers are preferably natural rubber, chloroprene rubber, butyl rubber, silicone rubber, ethylene-propylene rubber, urethane rubber, etc.

The thickness of the insulating layer 45 is preferably 0.5 mm or more, more preferably 1 mm or more. When the insulating layer 45 is thinner than 0.5 mm, the electromagnetic-wave-absorbing tape 44 is too close to the electromagnetic-wave-reflecting layer 46, resulting in insufficient attenuation of electromagnetic waves transmitting the electromagnetic-wave-absorbing tape 44. Though variable depending on the outer diameter of the electromagnetic wave absorption cable 40, the upper limit of the thickness of the insulating layer 45 is preferably 1.5 mm, more preferably 1.2 mm.

The insulating layer 45 may contain magnetic particles. The magnetic particles are preferably ferrite particles having high insulation. The sizes of the ferrite particles are not particularly restricted, unless they affect the formation of the insulating layer 45.

To reflect electromagnetic waves transmitting through the electromagnetic-wave-absorbing tape 44 and project them to the electromagnetic-wave-absorbing tape 44 again, the electromagnetic-wave-reflecting layer 46 should have a function of reflecting electromagnetic waves. To exhibit such function effectively, the electromagnetic-wave-reflecting layer 46 is preferably a metal foil, a metal net or a plastic film having a metal layer. The metal for forming the electromagnetic-wave-reflecting layer 46 is preferably at least one selected from the group consisting of aluminum, copper, silver, tin, nickel, cobalt, chromium and their alloys. To obtain a thin electromagnetic wave absorption cable 40, the electromagnetic-wave-reflecting layer 46 is preferably constituted by a thin metal film formed on a surface of a plastic film. The thin metal film is preferably a vapor-deposited film of the above metal. The thickness of the thin metal film may be several tens of nanometers to several tens of micrometers. The plastic film in the electromagnetic-wave-reflecting layer 46 may be the same as the plastic film 101 in the electromagnetic-wave-absorbing film 110.

When the electromagnetic-wave-reflecting layer 46 is a composite film constituted by a plastic film and a thin metal film formed on a surface of the plastic film, a ground line (not shown) is preferably attached to the composite film. Because electric current generated in the thin metal film flows out through the ground line, the electromagnetic-wave-shielding function can be enhanced. When the electromagnetic-wave-reflecting layer 46 is a conductive metal foil or net, the ground line need not be additionally attached.

(4) Another Example of Electromagnetic-Wave-Absorbing Tapes

Figure 10:
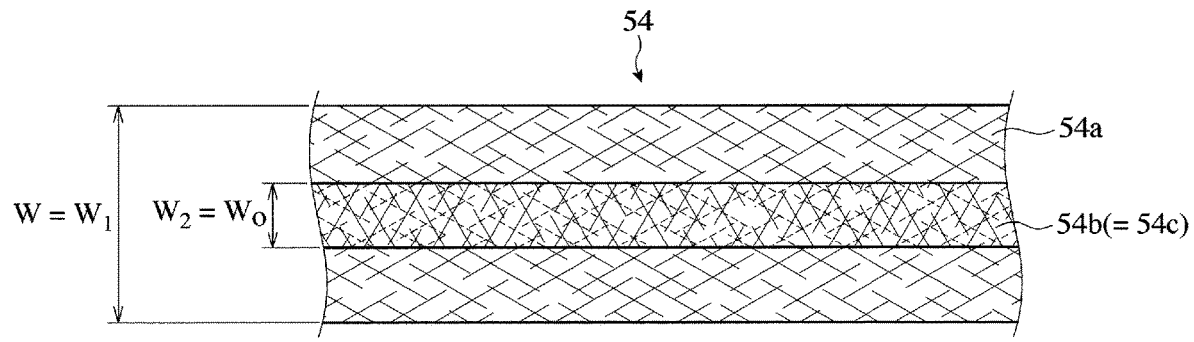
FIG. 10 is a partial plan view showing another example of electromagnetic-wave-absorbing tapes used in the first and second electromagnetic wave absorption cables.

FIG. 10 shows another example of electromagnetic-wave-absorbing tapes used in the first and second electromagnetic wave absorption cables. This electromagnetic-wave-absorbing tape 54 has a structure in which a narrow electromagnetic-wave-absorbing film 54b is disposed laterally inside a wide electromagnetic-wave-absorbing film 54a. Because the electromagnetic-wave-absorbing film 54b having a width $W_2$ is disposed inside the electromagnetic-wave-absorbing film 54a having a width $W_1$, the width Wo of an overlapped portion 54c is equal to the width $W_2$ of the electromagnetic-wave-absorbing film 54b, meeting the relation of $W=W_1+W_2-Wo=W_1$. In a region of the longitudinal width $D_3$ of an overlapped portion of the electromagnetic-wave-absorbing tape 54 wound around the insulating sheath 43, the same electromagnetic-wave-absorbing films 54a, 54a are overlapping substantially without crossing of linear scratches. In this case, an overlapped portion of two electromagnetic-wave-absorbing films 54a, 54b with linear scratches crossing is only the overlapped portion having a width $W_2$. Accordingly, $(D_2+D_3)/D$ is equal to $D_2/D$, and the Wo/W ratio is 30-70%, preferably 40-65%, more preferably 45-60%.

[2] Constituents of Electromagnetic Wave Absorption Cable (1) Electromagnetic-Wave-Absorbing Film As shown in FIGS. 11(a)-11(d), 12(a) and 12(b), the electromagnetic-wave-absorbing film 110 constituting the electromagnetic-wave-absorbing tape comprises a plastic film 101, and a single- or multi-layer, thin metal film 102 (102a, 102b) formed on at least one surface of the plastic film 101, the thin metal film 102 being provided with large numbers of substantially parallel, intermittent, linear scratches 120 with irregular widths and intervals in plural directions.

(a) Plastic Film

Resins forming the plastic film 101 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate (PET) is preferable. The thickness of the plastic film 101 may be about 8-30 μm.

(b) Thin Metal Film

Metals forming the thin metal film 102 are not particularly restrictive as long as they have conductivity, and they are preferably aluminum, copper, silver, tin, nickel, cobalt, chromium and their alloys, particularly aluminum, copper, nickel and their alloys from the aspect of corrosion resistance and cost. The thickness of the thin metal film 102 is preferably 0.01 μm or more. Though not restrictive, the upper limit of the thickness of the thin metal film 102 may be practically about 10 μm. Of course, the thin metal film 102 may be thicker than 10 μm, with substantially no change in the absorbability of high-frequency electromagnetic waves. Accordingly, the thickness of the thin metal film 102 is preferably 0.01-10 μm, more preferably 0.01-5 μm, most preferably 0.01-1 μm. The thin metal film 102 can be produced by vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

When the thin metal film 102 has a single-layer structure, the thin metal film 102 is preferably made of aluminum or nickel from the aspect of conductivity, corrosion resistance and cost. When the thin metal film 102 has a multi-layer structure, one layer may be made of a non-magnetic metal, while the other layer may be made of a magnetic metal. The non-magnetic metals include aluminum, copper, silver, tin and their alloys, and the magnetic metals include nickel, cobalt, chromium and their alloys. The magnetic thin metal film is preferably as thick as 0.01 µm or more, and the non-magnetic thin metal film is preferably as thick as 0.1 µm or more. Though not restrictive, the upper limits of their thicknesses may be practically about 10 µm. More preferably, the thickness of the magnetic thin metal film is 0.01-5 µm, and the thickness of the non-magnetic thin metal film is 0.1-5 µm. FIGS. 12(a) and 12(b) show two layers (thin metal films 102a, 120b) formed on a plastic film 101.

(c) Linear Scratches

Figure 11A:
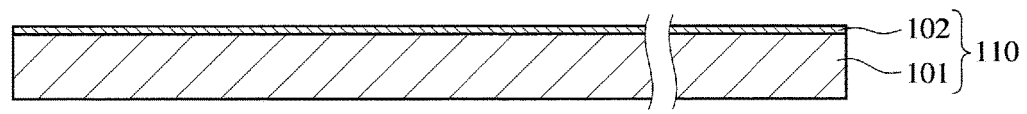
FIG. 11(a) is a cross-sectional view showing an electromagnetic-wave-absorbing film having a single-layer, thin metal film.
Figure 11B:
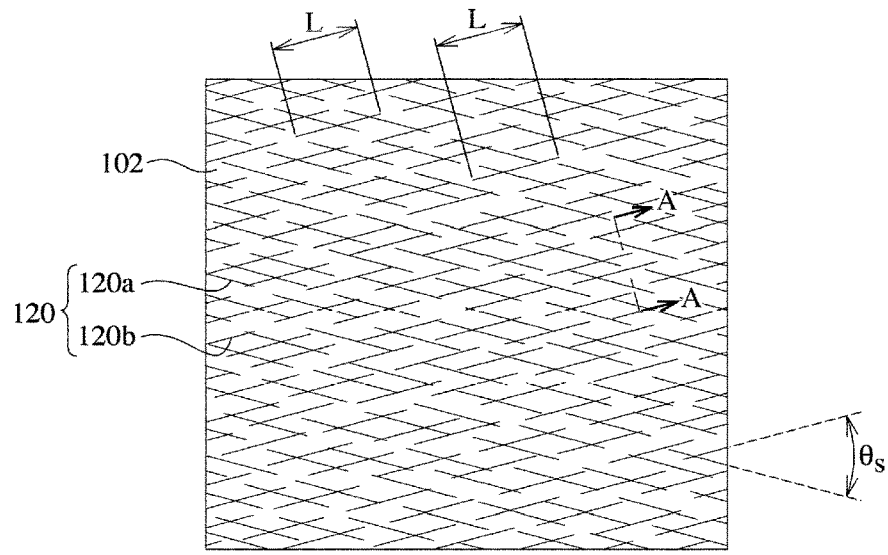
FIG. 11(b) is a partial plan view showing an example of linear scratches in the electromagnetic-wave-absorbing film.
Figure 11C:
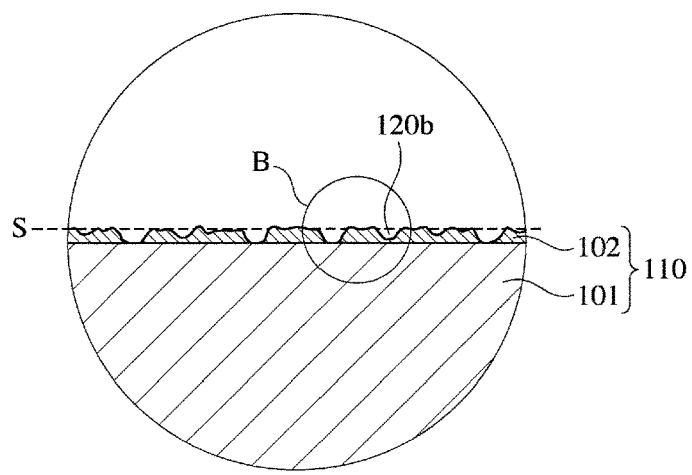
FIG. 11(c) is a cross-sectional view taken along the line A-A in FIG. 11(b).
Figure 11D:
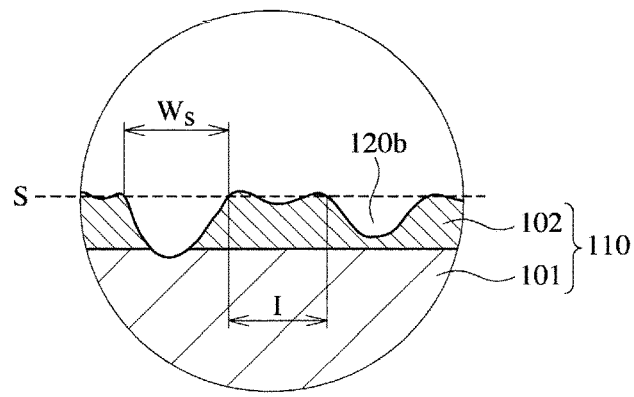
FIG. 11(d) is an enlarged cross-sectional view showing a portion B in FIG. 11(c).
Figure 12A:
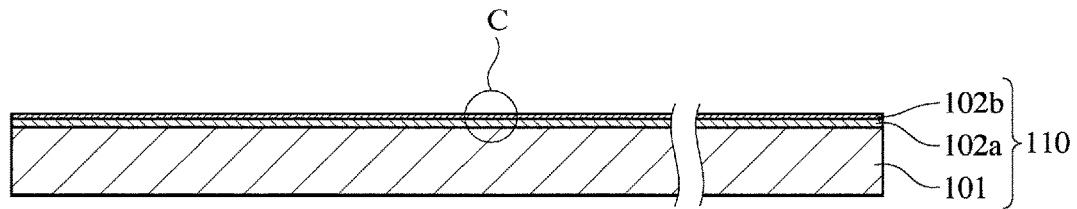
FIG. 12(a) is a cross-sectional view showing an electromagnetic-wave-absorbing film having a multi-layer, thin metal film.
Figure 12B:
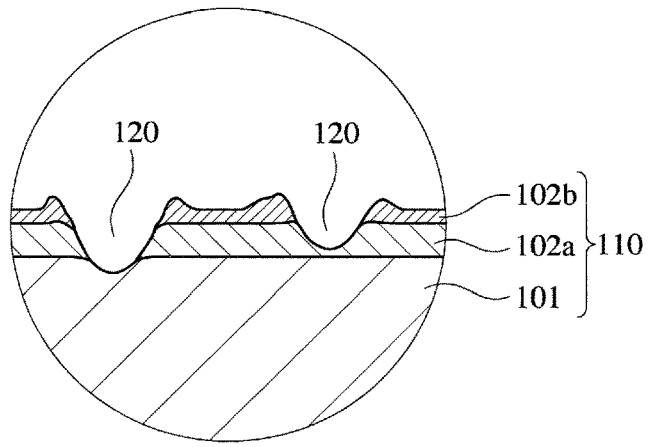
FIG. 12(b) is an enlarged cross-sectional view showing a portion C in FIG. 12(a).

In the example shown in FIGS. 11(a)-11(d), a thin metal film 102 is provided with large numbers of substantially parallel, intermittent, linear scratches 120a, 120b with irregular widths and intervals in two directions. The depth of linear scratches 120 is exaggerated in FIGS. 11(c) and 11(d) for the purpose of explanation. As shown in FIG. 11(d), the linear scratches 120 oriented in two directions have various widths Ws and intervals I. The widths Ws and intervals I of the linear scratches 120 are determined at a height corresponding to the surface S of the thin metal film 111b before forming linear scratches. Because the linear scratches 120 have various widths Ws and intervals I, the electromagnetic-wave-absorbing film 110 can efficiently absorb electromagnetic waves in a wide frequency range.

90% or more of the widths Ws of the linear scratches 120 are in a range of preferably 0.1-100 µm, more preferably 0.5-50 µm, most preferably 0.5-20 µm. The average width Wsav of the linear scratches 120 is preferably 1-50 µm, more preferably 1-10 µm, most preferably 1-5 µm.

The lateral intervals I of the linear scratches 120 are in a range of preferably 1-500 µm, more preferably 1-100 µm, most preferably 1-50 µM, particularly 1-30 µm. The average lateral interval Iav of the linear scratches 120 is preferably 1-200 µm, more preferably 5-50 µm, most preferably 5-30 µm.

Because the lengths L of the linear scratches 120 are determined by sliding conditions (mainly relative peripheral speeds of the roll and film, and the winding angle of the composite film to the roll), most linear scratches 120 have substantially the same lengths L (substantially equal to the average length Lav), unless the sliding conditions are changed. The lengths L of the linear scratches 120 may be practically about 1-100 mm, preferably 2-10 mm, though not particularly restrictive.

Figure 13:
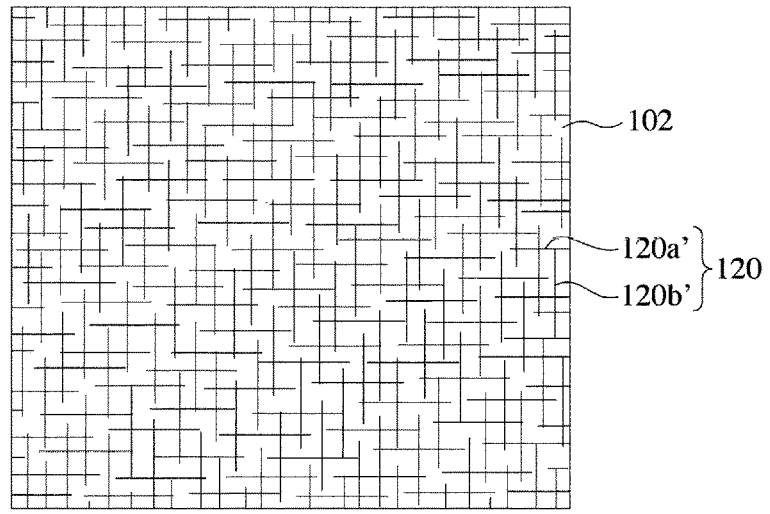
FIG. 13 is a plan view showing an electromagnetic-wave-absorbing film having perpendicularly crossing linear scratches.

The acute crossing angle θs, which may be simply called "crossing angle θs" unless otherwise mentioned, of the linear scratches 120a, 120b is preferably 30-90°, more preferably 60-90°. By adjusting the sliding conditions of the composite film to the pattern rolls (sliding directions, relative peripheral speeds, etc.), the linear scratches 120 having various crossing angles θs can be obtained. FIG. 13 shows an example of perpendicularly crossing linear scratches 120a', 120b'.

(d) Protective Layer

To protect the thin metal film 102 formed on the linear scratches 120, a protective plastic layer (not shown) is preferably formed on the thin metal film 102. The protective plastic layer is preferably formed by laminating an insulating resin film, or coating an insulating resin solution. The insulating resins include polyesters (polyethylene terephthalate, etc.), polyamides, polyimides, polycarbonates, acrylic resins, polystyrenes, polyvinyl chloride, epoxy resins, etc. The protective layer may be as thick as about 1-10 µm.

(e) Production Method

FIGS. 14(a)-14(e) show an example of apparatuses for forming linear scratches in two directions. This apparatus comprises (a) a reel 221 from which a composite film 200 having a thin metal film formed on a plastic film is wound off; (b) a first pattern roll 202a arranged in a different direction from the lateral direction of the composite film 200 on the side of the thin metal film 102; (c) a first push roll 203a arranged upstream of the first pattern roll 202a on the opposite side to the thin metal film 102; (d) a second pattern roll 202b arranged in an opposite direction to the first pattern roll 202a with respect to the lateral direction of the composite film 200 on the side of the thin metal film 102; (e) a second push roll 203b arranged downstream of the second pattern roll 202b on the opposite side to the thin metal film 102; (f) an electric-resistance-measuring means 204a arranged on the side of the thin metal film 102 between the first and second pattern rolls 202a, 202b; (g) an electric-resistance-measuring means 204b arranged downstream of the second pattern roll 202b on the side of the thin metal film 102; and (h) a reel 224, around which a linearly-scratched composite film (electromagnetic-wave-absorbing film) 110 is wound, in this order from upstream. In addition, pluralities of guide rolls 222, 223 are arranged at predetermined positions. Each pattern roll 202a, 202b is supported by a backup roll (for example, rubber roll) 205a, 205b to prevent bending.

Figure 14B:
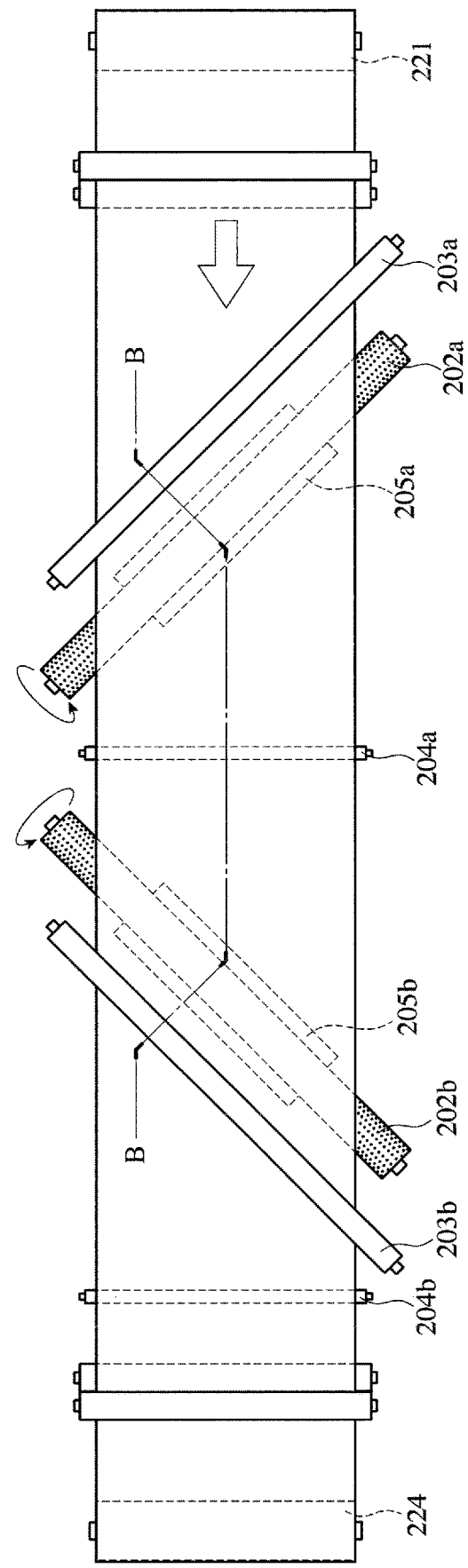
FIG. 14(b) is a plan view showing the apparatus of FIG. 14(a).
Figure 14C:
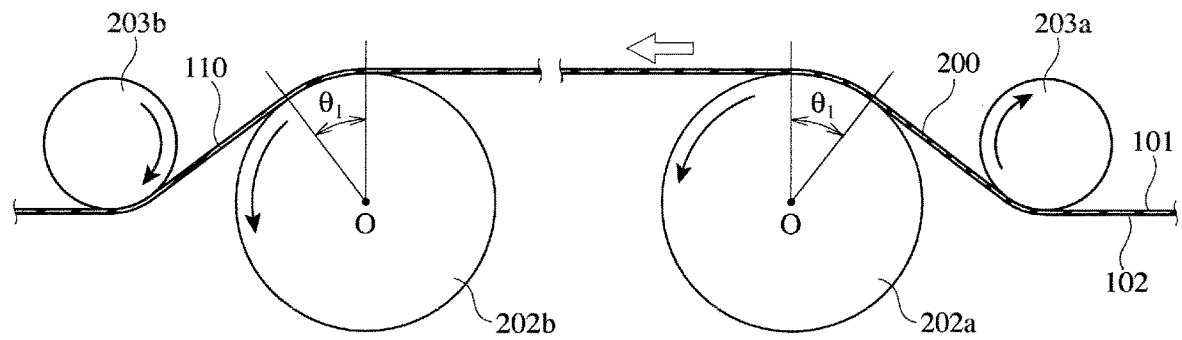
FIG. 14(c) is a cross-sectional view taken along the line B-B in FIG. 14(b).

Because the position of each push roll 203a, 203b is lower than a position at which the composite film 200 is brought into sliding contact with each pattern roll 202a, 202b as shown in FIG. 14(c), the thin metal film 102 of the composite film 200 is pushed to each pattern roll 202a, 202b. With this condition met, the vertical position of each push roll 203a, 203b may be adjusted to control the pressing power of each pattern roll 202a, 202b to the thin metal film 102, and a sliding distance represented by a center angle $θ_1$.

Figure 14D:
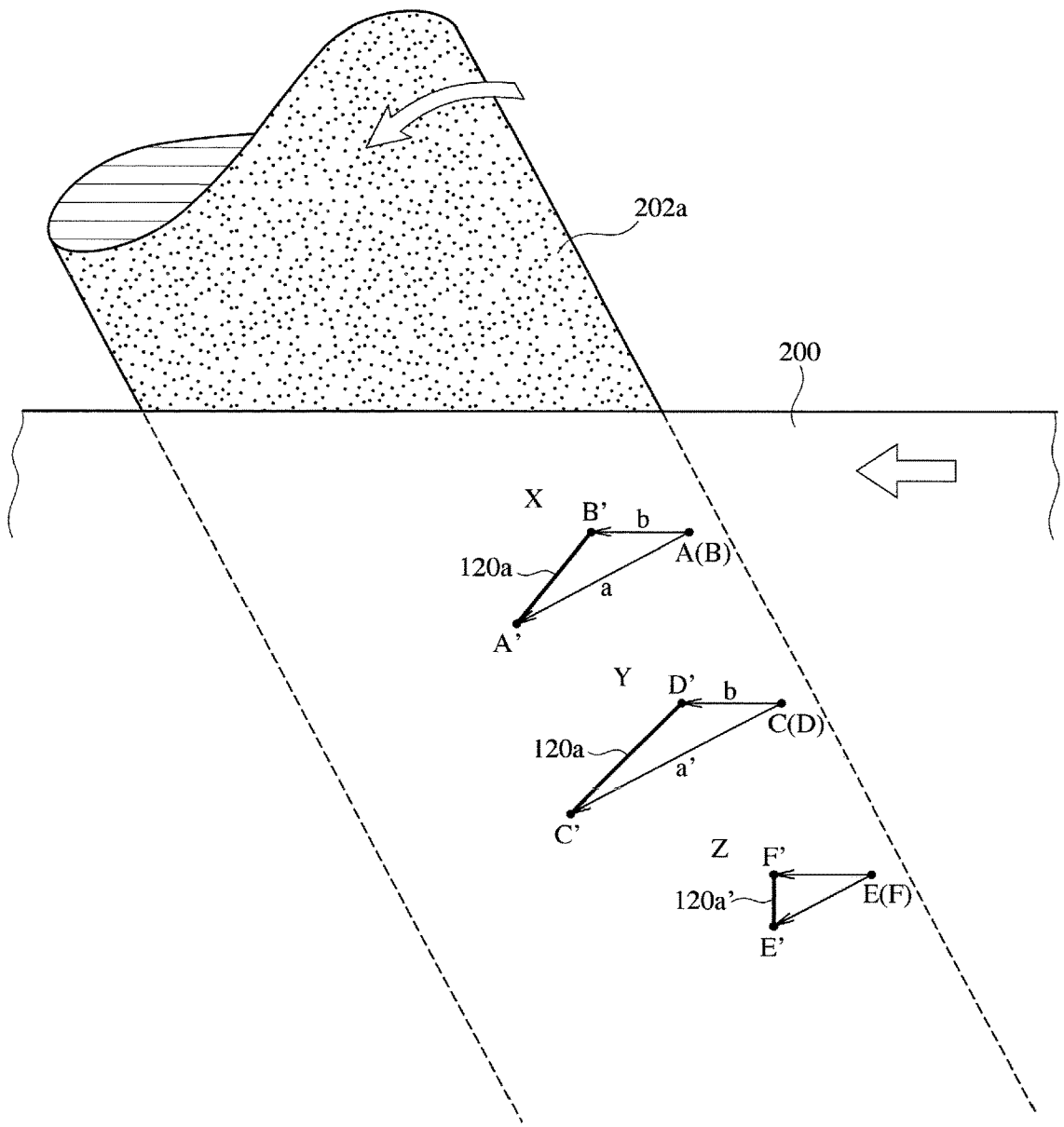
FIG. 14(d) is a partial, enlarged plan view for explaining the principle of forming linear scratches inclined relative to the moving direction of a composite film.
Figure 14E:
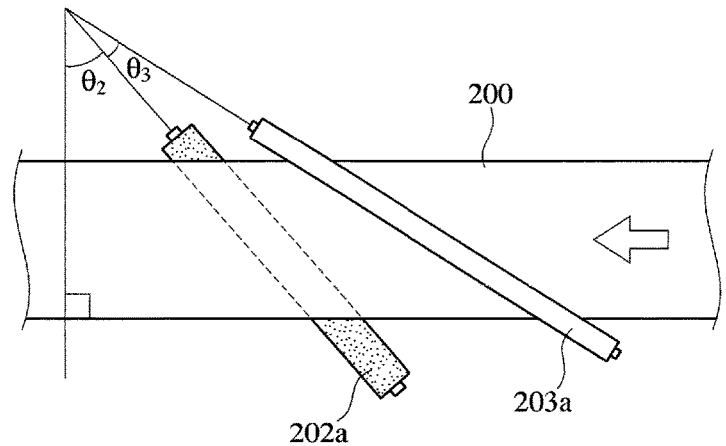
FIG. 14(e) is a partial plan view showing the inclination angles of a pattern roll and a push roll to a composite film in the apparatus of FIG. 14(a).

FIG. 14(d) shows the principle that linear scratches 120a are formed on the composite film 200 with inclination to the moving direction thereof. Because the pattern roll 202a is inclined to the moving direction of the composite film 200, the moving direction (rotation direction) a of fine, hard particles on the pattern roll 202a differs from the moving direction b of the composite film 200. After a fine, hard particle at a point A on the pattern roll 202a comes into contact with the thin metal film 102 to form a scratch B at an arbitrary time as shown by X, the fine, hard particle moves to a point A', and the scratch B moves to a point B', in a predetermined period of time. While the fine, hard particle moves from the point A to the point A', the scratch is continuously formed, resulting in a linear scratch 120a extending from the point B' to the point A'.

The directions and crossing angle θs of the first and second linear scratch groups 12A, 12B formed by the first and second pattern rolls 202a, 202b can be adjusted by changing the angle of each pattern roll 202a, 202b to the composite film 200, and/or the peripheral speed of each pattern roll 202a, 202b relative to the moving speed of the composite film 200. For instance, when the peripheral speed a of the pattern roll 202a relative to the moving speed b of the composite film 200 increases, the linear scratches 120a can be inclined 45° to the moving direction of the composite film 200 like a line C'D' as shown by Y in FIG. 14(d). Similarly, the peripheral speed a of the pattern roll 202a can be changed by changing the inclination angle $\theta_2$ of the pattern roll 202a to the lateral direction of the composite film 200. This is true of the pattern roll 202b. Accordingly, with both pattern rolls 202a, 202b adjusted, the directions of the linear scratches 120a, 120b can be changed as shown in FIG. 13.

Because each pattern roll 202a, 202b is inclined to the composite film 200, sliding contact with each pattern roll 202a, 202b is likely to exert a force in a lateral direction onto the composite film 200. To prevent the lateral displacement of the composite film 200, the vertical position and/or angle of each push roll 203a, 203b to each pattern roll 202a, 202b are preferably adjusted. For instance, the proper adjustment of a crossing angle $\theta_3$ between the axis of the pattern roll 202a and the axis of the push roll 203a can provide pressing power with such a lateral-direction distribution as to cancel lateral components, thereby preventing the lateral displacement. The adjustment of the distance between the pattern roll 202a and the push roll 203a also contributes to the prevention of the lateral displacement. To prevent the lateral displacement and breakage of the composite film 200, the rotation directions of the first and second pattern rolls 202a, 202b inclined from the lateral direction of the composite film 200 are preferably the same as the moving direction of the composite film 200.

As shown in FIG. 14(b), each electric-resistance-measuring means (roll) 204a, 204b comprises a pair of electrodes at both ends via an insulating portion, between which the electric resistance of the linearly-scratched thin metal film 102 is measured. The electric resistance measured by the electric-resistance-measuring means 204a, 204b is compared with the target electric resistance, to adjust the operation conditions such as the moving speed of the composite film 200, the rotation speeds and inclination angles $\theta_2$ of the pattern rolls 202a, 202b, the positions and inclination angles $\theta_3$ of the push rolls 203a, 203b, etc., depending on their difference.

Figure 15:
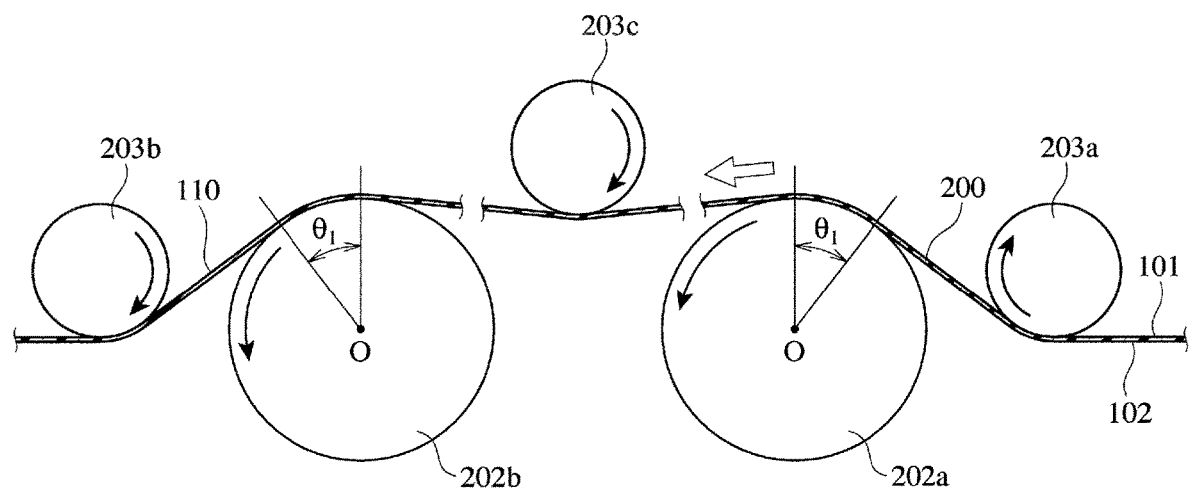
FIG. 15 is a partial cross-sectional view showing another example of apparatuses for forming linear scratches.

To increase the pressing forces of the pattern rolls 202a, 202b to the composite film 200, a third push roll 203c may be provided between the pattern rolls 202a, 202b as shown in FIG. 15. The third push roll 203c increases the sliding distance of the thin metal film 102 proportional to a center angle $\theta_1$, resulting in longer linear scratches 120a, 120b. The adjustment of the position and inclination angle of the third push roll 203c can contribute to the prevention of the lateral displacement of the composite film 200.

Figure 16:
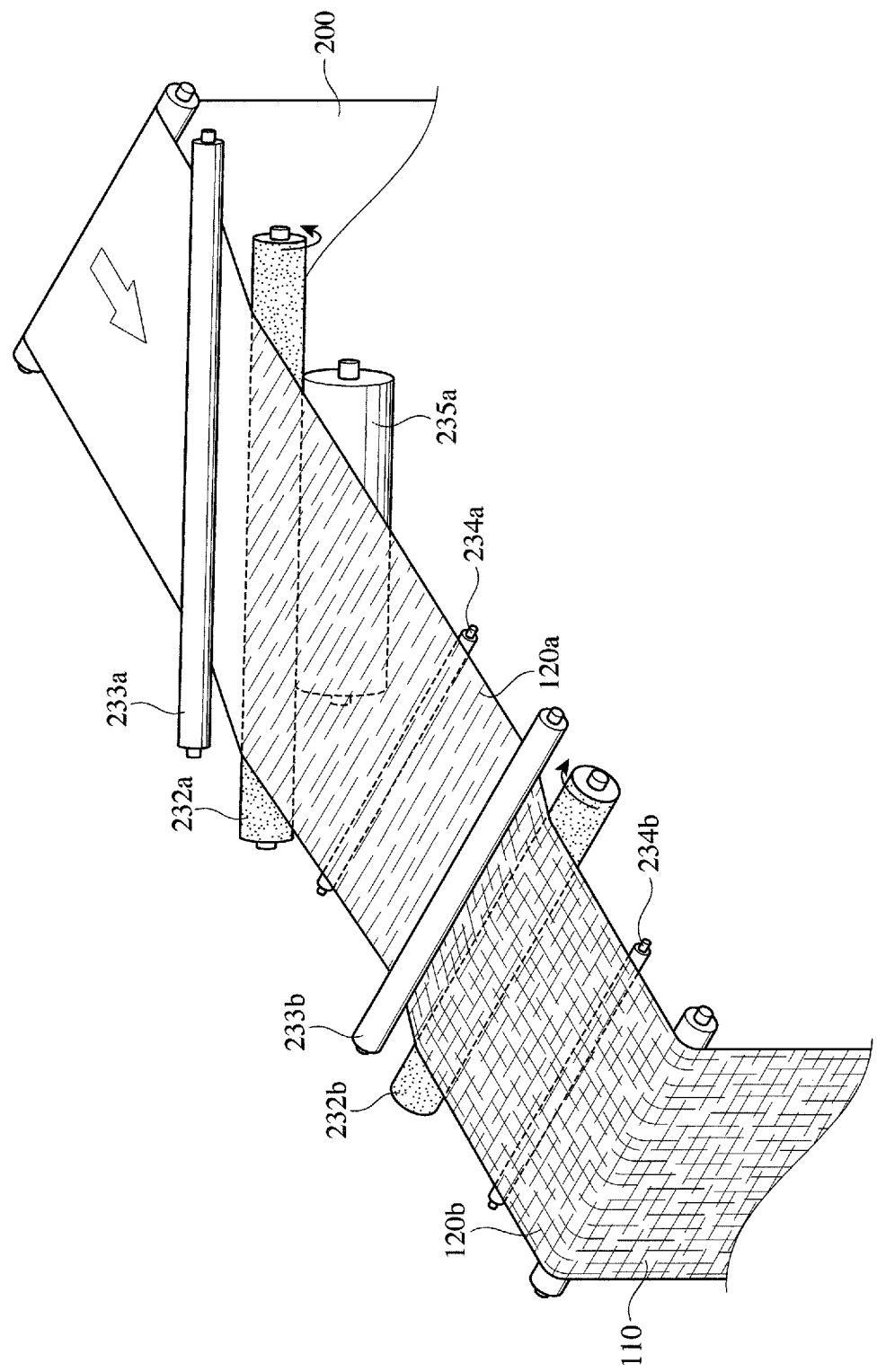
FIG. 16 is a perspective view showing a further example of apparatuses for forming linear scratches.

FIG. 16 shows another example of apparatuses for forming linear scratches oriented in two perpendicularly crossing directions as shown in FIG. 13. This apparatus differs from that shown in FIGS. 14(a)-14(e) in that the second pattern roll 232b is in parallel with the lateral direction of the composite film 200. Accordingly, only different parts from those in the apparatus shown in FIGS. 14(a)-14(e) will be explained. The rotation direction of the second pattern roll 232b may be the same as or opposite to the moving direction of the composite film 200. The second push roll 233b may be upstream or downstream of the second pattern roll 232b. This apparatus is suitable for the formation of linear scratches shown in FIG. 13, linear scratches 120a' (line E'F') being in the lateral direction of the composite film 200, as shown by Z in FIG. 14(d).

Operation conditions determining not only the inclination angles and crossing angles of linear scratches but also their depths, widths, lengths and intervals are the moving speed of the composite film 200, the rotation speeds, inclination angles and pressing forces of the pattern rolls, the tension of the composite film 200, etc. The moving speed of the composite film is preferably 5-200 m/minute, and the peripheral speed of the pattern roll is preferably 10-2,000 m/minute. The inclination angles $\theta_2$ of the pattern rolls are preferably 20° to 60°, particularly about 45°. The tension of the composite film 200 is preferably 0.05-5 kgf/cm width.

The pattern roll for forming linear scratches is preferably a roll having fine, hard particles with sharp edges and Mohs hardness of 5 or more on the surface, for example, the diamond roll described in JP 2002-59487 A. Because the widths of linear scratches are determined by the sizes of fine, hard particles, 90% or more of fine, hard particles have sizes in a range of preferably 1-1,000 µm, more preferably 10-200 µm. The fine, hard particles are attached to the roll surface preferably at an area ratio of 50% or more.

The present invention will be explained in more detail referring to Examples below without intention of restricting the present invention thereto.

Reference Example 1

Using an apparatus having the structure shown in FIG. 16 comprising pattern rolls 232a, 232b having electroplated fine diamond particles having a particle size distribution of 50-80 µm, perpendicularly crossing linear scratches as shown in FIG. 13 were formed in a thin aluminum film 102 having a thickness of 0.05 µm, which was formed on a surface of a biaxially oriented polyethylene terephthalate (PET) film as thick as 16 µm by a vacuum vapor deposition method. An optical photomicrograph of the linearly-scratched, thin aluminum film 102 revealed that the linear scratches had the following characteristics.

Range of widths Ws: 0.5-5 µm,
Average width Wsav: 2 µm,
Range of intervals I: 2-30 µm,
Average interval Iav: 20 µm,
Average length Lav: 5 mm, and
Acute crossing angle θs: 90°.

Reference Example 2

The same linear scratches as in Reference Example 1 were formed on a thin nickel film 102 having a thickness of 0.05 µm, which was formed on a surface of a PET film as thick as 16 µm by a vacuum vapor deposition method.

Reference Example 3

Using an apparatus having the structure shown in FIGS. 14(a)-14(e) comprising pattern rolls 202a, 202b having electroplated fine diamond particles having a particle size distribution of 50-80 µm, linear scratches oriented in two directions as shown in FIG. 11(b) with a crossing angle θs of 45° were formed on a thin aluminum film 102 formed on a surface of a PET film, in the same manner as in Reference Example 1. An optical photomicrograph of the linearly-scratched, thin aluminum film 102 revealed that the linear scratches had the following characteristics.

Range of widths Ws: 0.5-5 µm,
Average width Wsav: 2 µm,
Range of intervals I: 2-30 µm,
Average interval Iav: 20 µm,
Average length Lav: 5 mm, and
Acute crossing angle θs: 45°.

Reference Example 4

Linear scratches oriented in two directions as shown in FIG. 11(b) with a crossing angle θs of 60° were formed on a thin aluminum film 102 formed on a surface of a PET film, in the same manner as in Reference Example 3. An optical photomicrograph of the linearly-scratched, thin aluminum film 102 revealed that the linear scratches had the following characteristics.

Range of widths Ws: 0.5-5 μm,
Average width Wsav: 2 μm,
Range of intervals I: 2-30 μm,
Average interval Iav: 20 μm,
Average length Lav: 5 mm, and
Acute crossing angle θs: 60°.

Reference Examples 5 and 6

The electromagnetic-wave-absorbing film having a linearly-scratched, thin aluminum film in Reference Example 1, and the electromagnetic-wave-absorbing film having a linearly-scratched thin nickel film in Reference Example 2 were slit to obtain 20-mm-wide electromagnetic-wave-absorbing tapes 23. As shown in FIG. 3, each electromagnetic-wave-absorbing tape 23 was wound at an inclination angle of 45° around an inner insulating sheath 22 surrounding conductor wires (a bundle of thin copper wires) 21, with $D_1/D$ of ⅓ or more, and then covered with an outer insulating sheath 24 to form each electromagnetic wave absorption cable of Reference Examples 5 and 6.

Comparative Examples 1 and 2

The cable of Comparative Example 1 had the same structure as shown in FIG. 3, except that a PET tape having a thin aluminum film with no linear scratches was wound in place of the electromagnetic-wave-absorbing tape 23. The cable of Comparative Example 2 had the same structure as shown in FIG. 3 except that the electromagnetic-wave-absorbing tape 23 was not wound.

Figure 17:
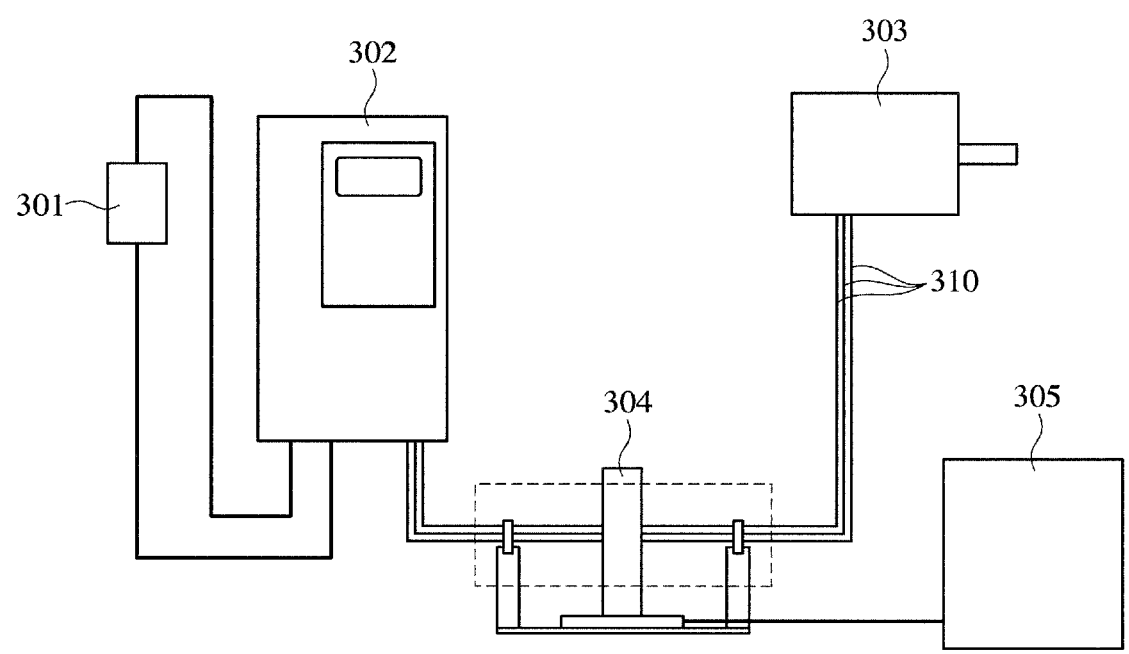
FIG. 17 is a schematic view showing an apparatus for measuring noises.

The electromagnetic wave absorbability of each cable of Reference Examples 5 and 6 and Comparative Examples 1 and 2 was measured by a noise-measuring apparatus shown in FIG. 17. The apparatus of FIG. 17 comprises a power supply 301, an inverter 302, a motor 303, and a three-core cable 310 connecting the power supply 301 to the motor 303 via the inverter 302. A clamp-type current meter 304 connected to a noise meter 305 ("NOISE HILOGGER 3145" available from HIOKI E. E. Corporation) was attached to an intermediate point of the three-core cable 310, to measure the change of current flowing in the three-core cable 310 as noise. With three-phase alternating current of 200 V, the frequency of the inverter 302 was changed from 0 Hz to 90 Hz over 100 seconds. As an example of the measurement results, noise at 250 kHz is shown in FIG. 18.

Figure 18:
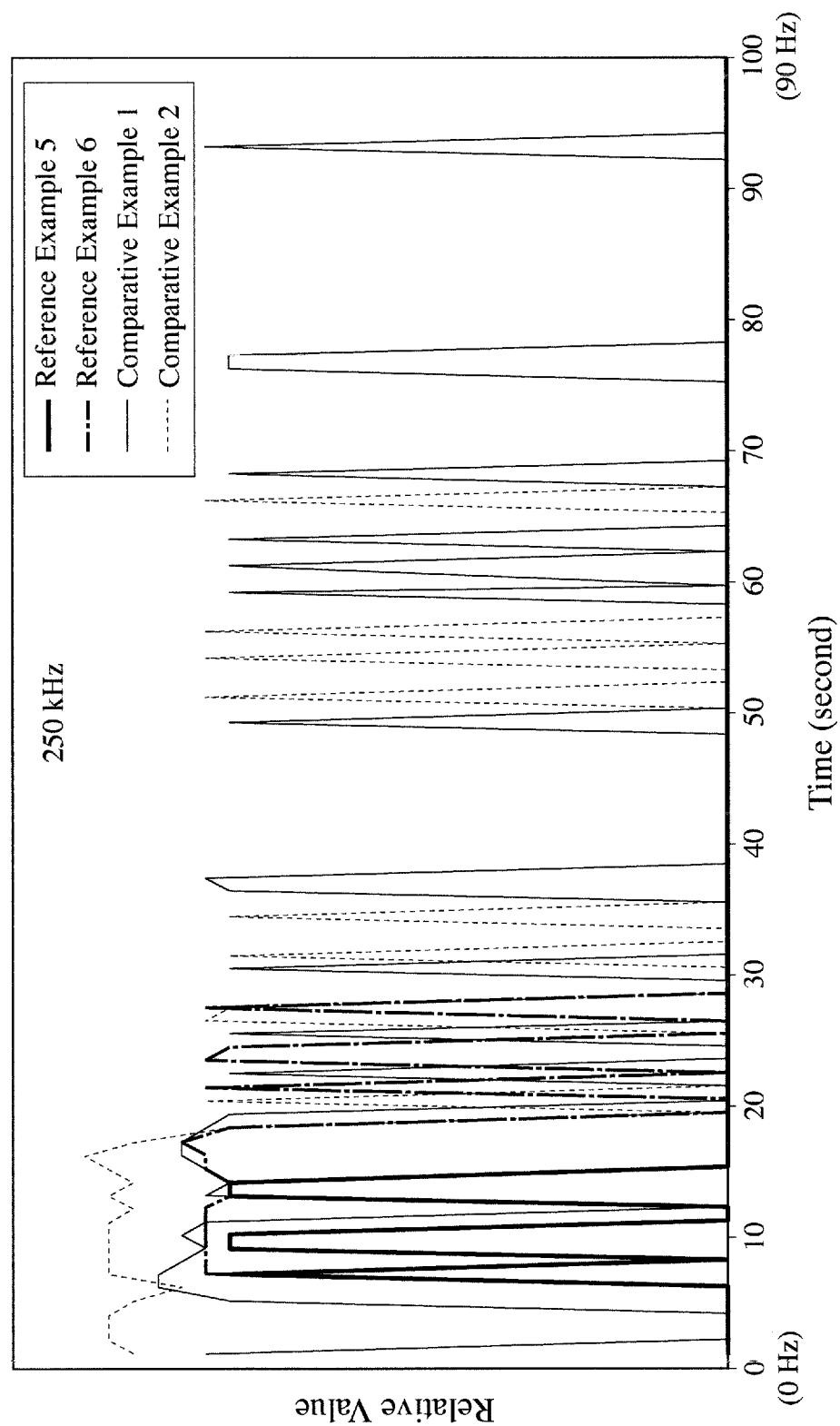
FIG. 18 is a graph showing noises at 250 kHz in the cables of Reference Examples 5 and 6, and Comparative Examples 1 and 2.

As is clear from FIG. 18, at 250 kHz, the cable of Comparative Example 1 wound with the PET tape having a thin aluminum film with no linear scratches (shield), and the cable of Comparative Example 2 free of the shield were on the same noise level, while the electromagnetic wave absorption cables of Reference Examples 5 and 6 each wound with the electromagnetic-wave-absorbing tape were on clearly lower noise levels than those of Comparative Examples 1 and 2. It was also found that the electromagnetic wave absorption cable of Reference Example 5 using the linearly-scratched, thin aluminum film exhibited higher noise absorbability than that of the electromagnetic wave absorption cable of Reference Example 6 using the linearly-scratched thin nickel film.

Example 1

Figure 19:
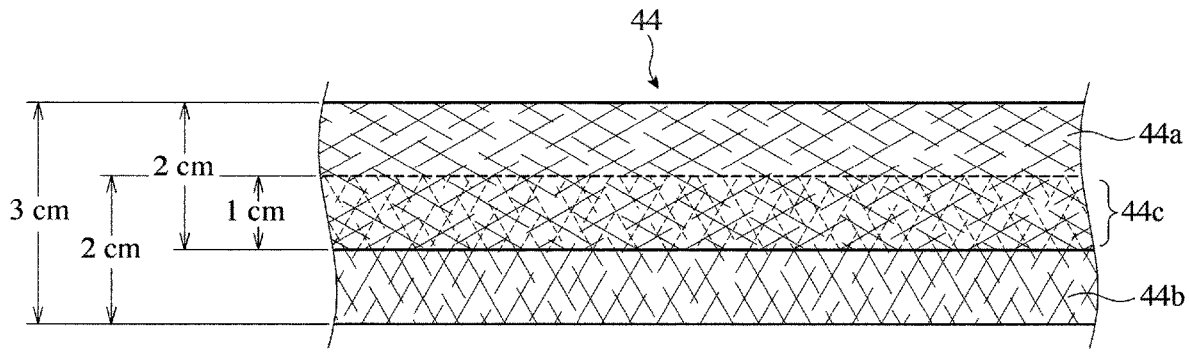
FIG. 19 is a plan view showing the electromagnetic-wave-absorbing tape used in Examples 1-3.

The electromagnetic-wave-absorbing film having linear scratches with a crossing angle θs of 90°, which was produced in Reference Example 1, was slit to provide two 2-cm-wide electromagnetic-wave-absorbing films 44a, 44b with linear scratches oriented as shown in FIG. 19. Both electromagnetic-wave-absorbing films 44a, 44b were adhered with a 1-cm-wide overlapped portion 44c, to produce a 3-cm-wide electromagnetic-wave-absorbing tape 44. The width Wo of the overlapped portion 44c in the electromagnetic-wave-absorbing tape 44 was ⅓ of the width W of the electromagnetic-wave-absorbing tape 44. Accordingly, the longitudinal width $D_2$ of the overlapped portion 44c was also ⅓ of the longitudinal width D of the electromagnetic-wave-absorbing tape 44.

Figure 6:
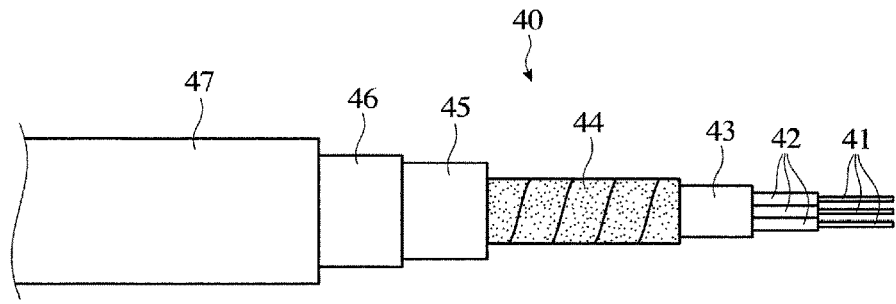
FIG. 6 is a plan view showing the second electromagnetic wave absorption cable of the present invention.
Figure 7:
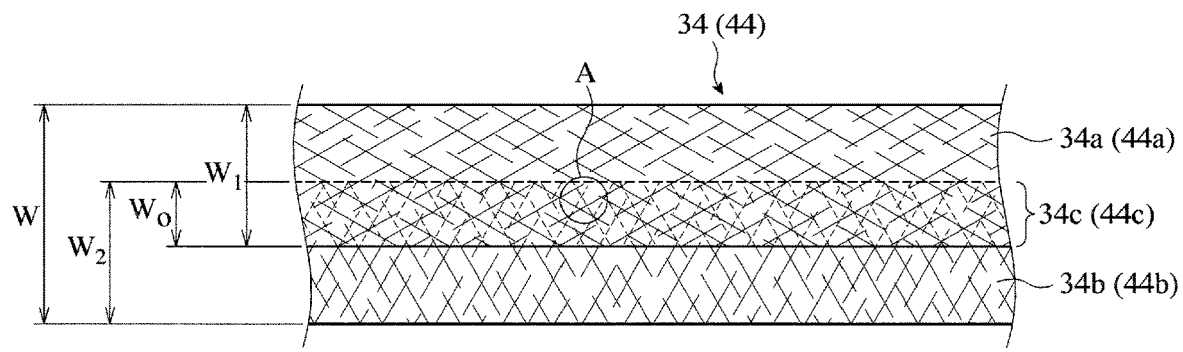
FIG. 7 is a partial plan view showing an example of electromagnetic-wave-absorbing tapes used in the first and second electromagnetic wave absorption cables.

An electromagnetic-wave-absorbing tape 44 was spirally wound around the inner insulating sheaths 42 of three conductor wires 41 via an insulating sheath 43; a 1-mm-thick butyl rubber sheet (insulating layer) 45 was wound around the electromagnetic-wave-absorbing tape 44; a Cu/Ni-vapor-deposited film (electromagnetic-wave-reflecting layer) 46 was wound around the insulating layer 45 with a Cu/Ni layer inside; and an outer insulating sheath 47 was wound around the Cu/Ni-vapor-deposited film 46, to produce an electromagnetic wave absorption cable 40 having the structure shown in FIG. 6. The longitudinal width $D_3$ of an overlapped portion of the electromagnetic-wave-absorbing tape 44 was 17% of the longitudinal width D of the electromagnetic-wave-absorbing tape 44. Accordingly, $(D_2+D_3)/D$ was 50%. The Cu/Ni-vapor-deposited film 46 had a 0.15-μm-thick Cu layer and a 0.1-μm-thick Ni layer formed on a surface of a 16-μm-thick PET film by a vacuum vapor deposition method. A ground line was connected to the Cu/Ni layer of the Cu/Ni-vapor-deposited film 46.

The resultant electromagnetic wave absorption cable 40 was set in a clamp-type current meter 304 connected to a noise meter 305 ("NOISE HILOGGER 3145" available from HIOKI E. E. Corporation) in the noise-measuring apparatus shown in FIG. 17, to measure the change of current flowing in the cable 40 as noise. With three-phase alternating current of 200 V, the frequency of the inverter 302 was changed from 0 Hz to 90 Hz over 100 seconds. Also, as a reference, a cable having the same structure as shown in FIG. 6 except for having no electromagnetic-wave-absorbing tape 44, no butyl rubber sheet (insulating layer) 45 and no Cu/Ni-vapor-deposited film (electromagnetic-wave-reflecting layer) 46 was set in the noise-measuring apparatus shown in FIG. 17, to measure noises under the same conditions as above. As a result, the noise level (expressed by current level) at a frequency of 20 MHz was as low as 0.01-0.012 A in the electromagnetic wave absorption cable 40 of Example 1, while it was 0.014 A in the reference.

Example 2

An electromagnetic wave absorption cable 40 was produced in the same manner as in Example 1, except for using two electromagnetic-wave-absorbing films 44a, 44b produced in Reference Example 3, in which the crossing angle θs of linear scratches was 45°, to measure noises under the same conditions as in Reference Example 5 by the noise-measuring apparatus shown in FIG. 17. As a result, the noise level (expressed by current level) at a frequency of 20 MHz was as low as 0.01 A.

Example 3

An electromagnetic wave absorption cable 40 was produced in the same manner as in Example 1, except for using two electromagnetic-wave-absorbing films 44*a*, 44*b* produced in Reference Example 4, in which the crossing angle θs of linear scratches was 60°, to measure noises under the same conditions as in Reference Example 5 by the noise-measuring apparatus shown in FIG. 17. As a result, the noise level (expressed by current level) at a frequency of 20 MHz was as low as 0.01-0.012 A.

Example 4

A three-core cabtyre cable with nothing attached to an insulating sheath 43 having an outer diameter of 13 mm was used as Sample 1, and the same three-core cabtyre cable with a ferrite core (E04SR301334 available from Seiwa Electric Mfg. Co., Ltd.) attached to the insulating sheath 43 was used as Sample 2. Further, as shown in FIG. 6, the same three-core cabtyre cables each having on the insulating sheath 43 a combination of an electromagnetic-wave-absorbing tape 44, a butyl rubber sheet (insulating layer) 45, and a grounded Cu/Ni-vapor-deposited film (electromagnetic-wave-reflecting layer) 46 as shown in Table 1 were used as Samples 3-5. In the electromagnetic-wave-absorbing tapes 44 in Samples 3-5, two 2-cm-wide electromagnetic-wave-absorbing films were bonded by 1-cm overlap, with the crossing angles θs of linear scratches of 90°, 60° and 45°, respectively.

Figure 20:
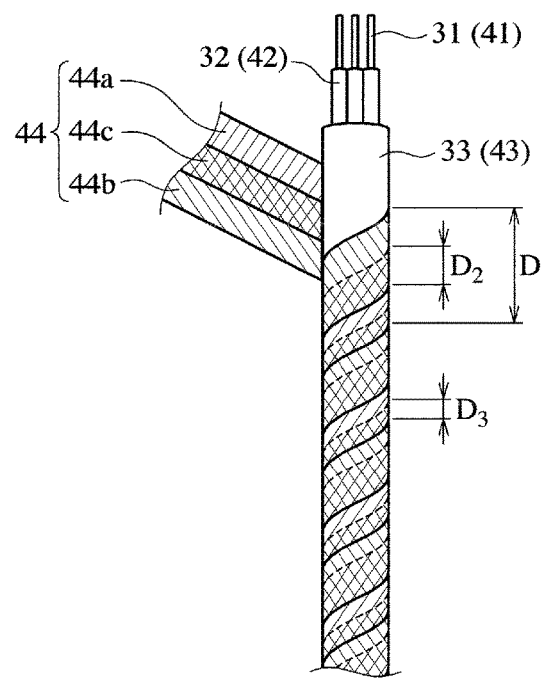
FIG. 20 is a partially developed plan view showing the electromagnetic wave absorption cable used in Example 4.

As shown in FIG. 20, the longitudinal width $D_3$ of an overlapped portion of the electromagnetic-wave-absorbing tape 44 spirally wound around the insulating sheath 43 was 17% of the longitudinal width D, and $(D_2+D_3)/D$ was 50%. In the cable of each Sample, noises were measured under the same conditions as in Reference Example 5. The noises (expressed by current level) at 5 MHz and 20 MHz are shown in Table 1.

netic-wave-absorbing tape spirally wound around the inner insulating sheath is constituted by two electromagnetic-wave-absorbing films each comprising a thin metal film formed on at least one surface of a plastic film and having linear scratches in plural directions, which are laterally partially overlapped, the linear scratches of both electromagnetic-wave-absorbing films being crossing, and the total $(D_2+D_3)$ of the longitudinal width $D_2$ of an overlapped portion of the electromagnetic-wave-absorbing films and the longitudinal width $D_3$ of an overlapped portion of the electromagnetic-wave-absorbing tape being 30-70% of the longitudinal width D of the electromagnetic-wave-absorbing tape.

The second electromagnetic wave absorption cable of the present invention can suppress the radiation and intrusion of electromagnetic waves more effectively than the first electromagnetic wave absorption cable, because it comprises an insulating layer covering the electromagnetic-wave-absorbing tape, and an electromagnetic-wave-reflecting layer covering the insulating layer, with all the requirements of the first electromagnetic wave absorption cable met.

The electromagnetic wave absorption cables of the present invention having such structures can be used not only as cables for transmitting signals of various frequencies, but also as power-supplying cables connected to various noise-generating electric or electronic appliances.

DESCRIPTION OF REFERENCE NUMERALS

10, 20, 30, 40: Electromagnetic wave absorption cable
11, 21, 31, 41: Conductor wire
12, 22, 32, 42: Inner insulating sheath
13, 23, 34, 44: Electromagnetic-wave-absorbing tape
14, 24, 35, 47: Outer insulating sheath

TABLE 1

| Sample No. | Electromagnetic-Wave-Absorbing Tape | Insulating Layer | Electromagnetic-Wave-Reflecting Layer | Ferrite Core | Noises (A) at 5 MHz | Noises (A) at 20 MHz |
|---|---|---|---|---|---|---|
| 1 | No | No | No | No | 0.012-0.014 | 0.014-0.017 |
| 2 | No | No | No | Yes | 0.013-0.014 | 0.008-0.01 |
| 3 | 90° + 90°[(1)] | Yes | Yes | No | 0.01 | 0.006-0.007 |
| 4 | 60° + 60°[(2)] | Yes | Yes | No | 0.01-0.012 | 0.006-0.008 |
| 5 | 45° + 45°[(3)] | Yes | Yes | No | 0.01-0.012 | 0.007-0.012 |

Note:
[(1)] The minimum crossing angle α between linear scratches in both electromagnetic-wave-absorbing films was 45°.
[(2)] The minimum crossing angle α between linear scratches in both electromagnetic-wave-absorbing films was 30°.
[(3)] The minimum crossing angle α between linear scratches in both electromagnetic-wave-absorbing films was 45°.

As is clear from Table 1, Samples 3-5 each comprising a wound electromagnetic-wave-absorbing tape constituted by two laterally partially overlapped electromagnetic-wave-absorbing films with crossing linear scratches, the minimum crossing angle α of linear scratches in both electromagnetic-wave-absorbing films being in a range of 30-45°, and the electromagnetic-wave-reflecting layer being wound around the electromagnetic-wave-absorbing tape via an insulating layer, exhibited higher noise reduction ratios than those of Sample 1 with no additional members (reference), and Sample 2 with only a ferrite core attached.

Effects of the Invention

The first electromagnetic wave absorption cable of the present invention can effectively suppress the radiation and intrusion of electromagnetic waves, because the electromag-

33, 43: Insulating sheath
34*a*, 34*b*, 44*a*, 44*b*, 54*a*, 54*b*: Electromagnetic-wave-absorbing film
34*c*, 44*c*, 54*c*: Overlapped portion of electromagnetic-wave-absorbing films
45: Insulating layer
46: Electromagnetic-wave-reflecting layer
110: Electromagnetic-wave-absorbing film
101: Plastic film
102: Thin metal film
120, 120*a*, 120*b*: Linear scratch
200: Composite film of thin metal film and plastic film
202*a*, 202*b*, 232*a*, 232*b*: Pattern roll
203*a*, 203*b*, 233*a*, 233*b*: Push roll
204*a*, 204*b*, 234*a*, 234*b*: Electric-resistance-measuring means (roll)
205*a*, 205*b*, 235*a*: Backup roll 221, 224: Reel
222, 223: Guide roll
301: Power supply
302: Inverter
303: Motor
304: Clamp-type current meter
305: Noise meter
D: Longitudinal width of electromagnetic-wave-absorbing tape (longitudinal tape width)
$D_1$: Longitudinal overlap width of electromagnetic-wave-absorbing tape (longitudinal tape overlap width)
$D_2$: Longitudinal width of overlapped portion of electromagnetic-wave-absorbing films (longitudinal film overlap width)
$D_3$: Longitudinal width of overlapped portion of electromagnetic-wave-absorbing tape (longitudinal tape overlap width)
W: Width of electromagnetic-wave-absorbing tape
$W_1$, $W_2$: Widths of two electromagnetic-wave-absorbing films
$W_o$: Width of overlapped portion of two electromagnetic-wave-absorbing films
α: Crossing angle of linear scratches in two electromagnetic-wave-absorbing films
$α_a$, $α_b$: Inclination angle of linear scratches to centerline of conductor wire
θs: Acute crossing angle of linear scratches in each electromagnetic-wave-absorbing film
Ws: Width of linear scratch
Wsav: Average width of linear scratches
I: Interval of linear scratches
Iav: Average interval of linear scratches
Lav: Average length of linear scratches

What is claimed is:

1. An electromagnetic wave absorption cable comprising at least one conductor wire, at least one inner insulating sheath surrounding each conductor wire, and an electromagnetic-wave-absorbing tape spirally wound around each or all of said inner insulating sheaths;
said electromagnetic-wave-absorbing tape being constituted by two electromagnetic-wave-absorbing films which are laterally partially overlapped;
each electromagnetic-wave-absorbing film comprising a plastic film, and a single- or multi-layer, thin metal film formed on at least one surface of said plastic film, said thin metal film being provided with large numbers of substantially parallel, intermittent, linear scratches with irregular widths and intervals in plural directions;
the linear scratches in each electromagnetic-wave-absorbing film having an acute crossing angle θs in a range of 30-90°;
the linear scratches in one electromagnetic-wave-absorbing film and the linear scratches in the other electromagnetic-wave-absorbing film being crossing each other; and
the total ($D_2+D_3$) of the longitudinal width $D_2$ of an overlapped portion of said electromagnetic-wave-absorbing films and the longitudinal width $D_3$ of an overlapped portion of said electromagnetic-wave-absorbing tape being 30-70% of the longitudinal width D of said electromagnetic-wave-absorbing tape.

2. The electromagnetic wave absorption cable according to claim 1, wherein the width W of said electromagnetic-wave-absorbing tape, the widths $W_1$, $W_2$ of both electromagnetic-wave-absorbing films, and the width Wo of an overlapped portion of both electromagnetic-wave-absorbing films meet the relations of $W=W_1+W_2-Wo$, and $Wo/W=20-60\%$.

3. The electromagnetic wave absorption cable according to claim 1, wherein the longitudinal width $D_3$ of an overlapped portion of said electromagnetic-wave-absorbing tape is 1-50% of the longitudinal width D of said electromagnetic-wave-absorbing tape.

4. The electromagnetic wave absorption cable according to claim 1, wherein the minimum crossing angle α between said linear scratches in one electromagnetic-wave-absorbing film and said linear scratches in the other electromagnetic-wave-absorbing film is 10-45°.

5. The electromagnetic wave absorption cable according to claim 1, wherein each electromagnetic-wave-absorbing film has linear scratches oriented in two directions, with a crossing angle in a range of 30-90°.

6. The electromagnetic wave absorption cable according to claim 5, wherein the linear scratches of said electromagnetic-wave-absorbing film in said electromagnetic-wave-absorbing tape wound around said inner insulating sheath are inclined at an angle in a range of 30-60° to said conductor wire.

7. The electromagnetic wave absorption cable according to claim 1, wherein said electromagnetic wave absorption cable further comprises an insulating layer covering said electromagnetic-wave-absorbing tape, and an electromagnetic-wave-reflecting layer covering said insulating layer.

8. The electromagnetic wave absorption cable according to claim 7, wherein said insulating layer contains magnetic particles.

9. The electromagnetic wave absorption cable according to claim 7, wherein said electromagnetic-wave-reflecting layer is constituted by a plastic film, and a single- or multi-layer, thin metal film formed on the plastic film.

10. The electromagnetic wave absorption cable according to claim 7, wherein a ground line is attached to said electromagnetic-wave-reflecting layer.

* * * * *